US009624602B2

(12) United States Patent
Kageshima et al.

(10) Patent No.: US 9,624,602 B2
(45) Date of Patent: *Apr. 18, 2017

(54) EPITAXIAL WAFER MANUFACTURING DEVICE AND MANUFACTURING METHOD

(75) Inventors: Yoshiaki Kageshima, Chichibu (JP); Daisuke Muto, Chichibu (JP); Kenji Momose, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 308 days.

This patent is subject to a terminal disclaimer.

(21) Appl. No.: 14/236,272

(22) PCT Filed: Aug. 3, 2012

(86) PCT No.: PCT/JP2012/069858
§ 371 (c)(1),
(2), (4) Date: Jan. 30, 2014

(87) PCT Pub. No.: WO2013/021947
PCT Pub. Date: Feb. 14, 2013

(65) Prior Publication Data
US 2014/0230722 A1 Aug. 21, 2014

(30) Foreign Application Priority Data
Aug. 5, 2011 (JP) ................................. 2011-171636

(51) Int. Cl.
*C30B 25/02* (2006.01)
*C30B 29/36* (2006.01)
(Continued)

(52) U.S. Cl.
CPC .......... *C30B 25/02* (2013.01); *C23C 16/4401* (2013.01); *C30B 25/10* (2013.01);
(Continued)

(58) Field of Classification Search
CPC ........ C30B 35/005; C30B 25/02; C30B 25/14
See application file for complete search history.

(56) References Cited

U.S. PATENT DOCUMENTS

2003/0185965 A1  10/2003  Lin et al.
2004/0003779 A1   1/2004  Jurgensen et al.
(Continued)

FOREIGN PATENT DOCUMENTS

EP  1 060 301       12/2000
EP  2 735 630 A1    5/2014
(Continued)

OTHER PUBLICATIONS

International Search Report for PCT/JP2012/069858, dated Nov. 6, 2012.
(Continued)

*Primary Examiner* — Robert M Kunemund
(74) *Attorney, Agent, or Firm* — Sughrue Mion, PLLC

(57) ABSTRACT

An epitaxial wafer manufacturing device, including a shield (12), which in addition to being removably attached inside a chamber, is arranged in close proximity to the lower surface of a top plate (3). The shield has a substrate (12a) having an opening (13) in the central portion thereof that forces a gas inlet (9) to face the inside of a reaction space (K), and a thin film (12b) that covers the lower surface of the substrate. The surface of the thin film has the shape of surface irregularities corresponding to fine surface irregularities formed in the lower surface of the substrate. When the shield has undergone thermal deformation as a result of being heated by heating means (8), deposits deposited on the lower surface of the shield are inhibited from falling off by the shape of the surface irregularities.

14 Claims, 13 Drawing Sheets

(51) Int. Cl.
*C30B 25/10* (2006.01)
*C30B 25/12* (2006.01)
*C23C 16/44* (2006.01)
*H01L 21/02* (2006.01)

(52) U.S. Cl.
CPC .............. *C30B 25/12* (2013.01); *C30B 29/36* (2013.01); *H01L 21/02378* (2013.01); *H01L 21/02529* (2013.01)

(56) References Cited

U.S. PATENT DOCUMENTS

| | | |
|---|---|---|
| 2004/0086689 A1 | 5/2004 | Takahashi et al. |
| 2011/0207299 A1 | 8/2011 | Sakurai |
| 2014/0190400 A1 | 7/2014 | Kageshima et al. |

FOREIGN PATENT DOCUMENTS

| | | |
|---|---|---|
| JP | 2000-68208 A | 3/2000 |
| JP | 2001-192818 A | 7/2001 |
| JP | 2004-507897 A | 3/2004 |
| JP | 2005-93477 A | 4/2005 |
| JP | 2005-235845 A | 9/2005 |
| JP | 2006-28625 A | 2/2006 |
| JP | 2006-339673 A | 12/2006 |
| JP | 2008-177187 A | 7/2008 |
| JP | 2009-164162 A | 7/2009 |
| JP | 2010-255083 A | 11/2010 |
| WO | 2010053094 A1 | 5/2010 |

OTHER PUBLICATIONS

Bernd Thomas, et al., "Epitaxial Growth of n-Type 4H-SiC on 3" Wafers for Power Devices", SiCED Electronics Development GmbH & Co., KG, Materials Science Forum, 2005, pp. 141-146, vols. 483-485.
James D. Oliver, et al., "A Designed Experiment Approach to Improvement and Understanding of the SiC Epitaxial Growth Process", Advanced Technology Center, Northrop Grumman Electronic Systems, Materials Science Forum, 2007, pp. 57-60, vols. 556-557.
Communication dated Feb. 13, 2015, issued by the European Patent Office in counterpart Application No. 12822286.6.
Communication dated Sep. 15, 2015 from the Japanese Patent Office in application No. 2011-171636.
International Search Report for PCT/JP2012/069695 dated Nov. 6, 2012.
Extended European Search Report dated Feb. 5, 2015, issued by the European Patent Office in European Application No. 12821468.1.
Communication dated Sep. 15, 2015 from the Japanese Patent Office in Application No. 2011-171635.
Office Action from the USPTO dated Feb. 12, 2016, issued in U.S. Appl. No. 14/236,951, 14 pages.
Final Office Action from the USPTO dated Jul. 25, 2016, in U.S. Appl. No. 14/236,951, 7 pages.

CROSS-SECTION TAKEN ALONG X-X'

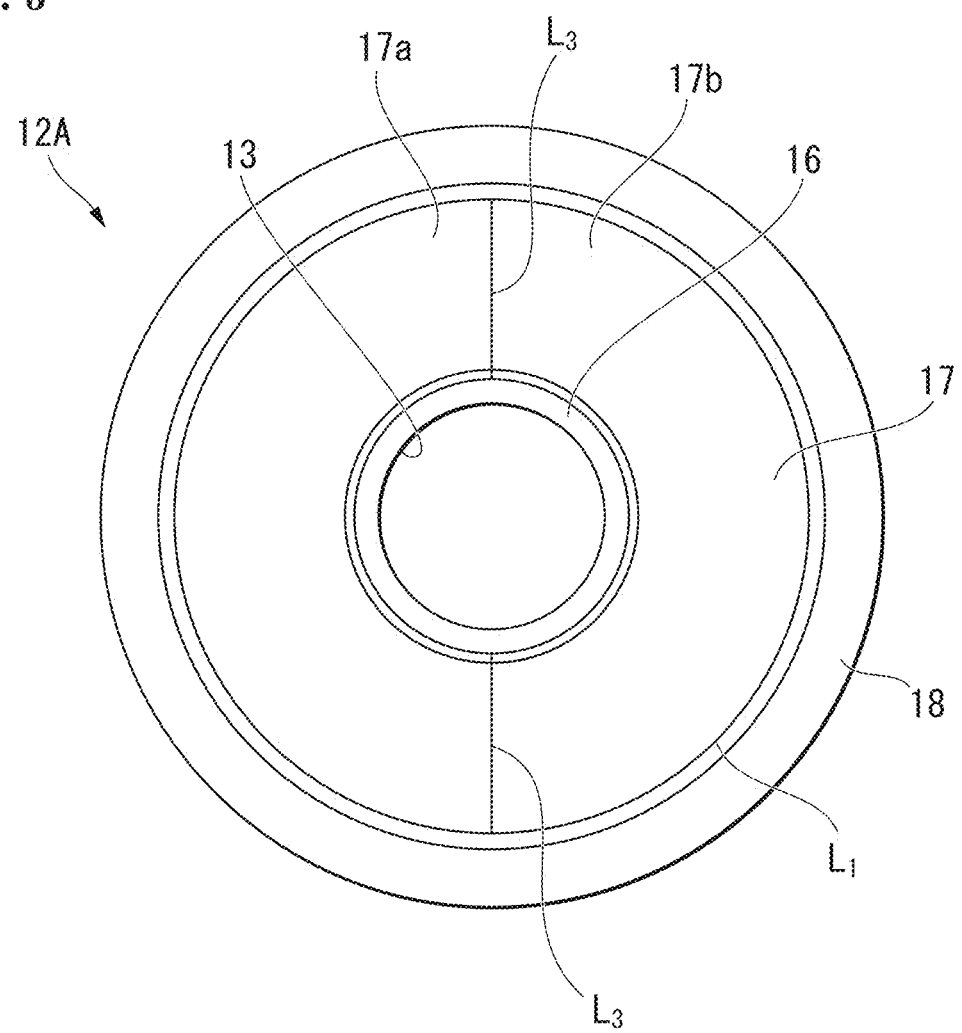

CROSS-SECTION TAKEN ALONG X-X'

CROSS-SECTION TAKEN ALONG X-X'

EPITAXIAL WAFER MANUFACTURING DEVICE AND MANUFACTURING METHOD

CROSS REFERENCE TO RELATED APPLICATIONS

This application is a National Stage of International Application No. PCT/JP2012/069858 filed Aug. 3, 2012, claiming priority based on Japanese Patent Application No. 2011-171636, filed Aug. 5, 2011, the contents of all of which are incorporated herein by reference in their entirety.

TECHNICAL FIELD

The present invention relates to an epitaxial wafer manufacturing device that deposits and grows epitaxial layers on the surfaces of heated wafers while supplying a raw material gas inside a chamber, and an epitaxial wafer manufacturing method that uses this manufacturing device.

The present application claims priority on the basis of Japanese Patent Application No. 2011-171636, filed in Japan on Aug. 5, 2011, the contents of which are incorporated herein by reference.

BACKGROUND ART

Silicon carbide (SiC), for example, has the outstanding properties of having a band gap roughly three times wider, dielectric breakdown electric field strength roughly ten times stronger, and thermal conductivity roughly three times greater than silicon (Si), and is expected to be used in applications such as power devices, high-frequency devices or high-temperature operation devices.

SiC epitaxial wafers are normally used to manufacture such SiC semiconductor devices. SiC epitaxial wafers are fabricated by epitaxially growing an SiC single crystal thin film (epitaxial layer) to serve as the active region of the SiC semiconductor device on the surface of an SiC single crystal substrate (wafer) fabricated using a method such as sublimation recrystallization.

In addition, a chemical vapor deposition (CVD) device, which deposits and grows SiC epitaxial layers on the surfaces of heated SiC wafers while supplying a raw material gas to a chamber, is used for the epitaxial wafer manufacturing device.

In this CVD device, the SiC wafers are required to be heated to a high temperature in order to induce epitaxial growth of the SiC epitaxial layers. Consequently, a method is used in which the susceptor on which the wafers are mounted and the ceiling (top plate) arranged opposing the upper surface of this susceptor are heated by high-frequency induction heating, and the wafers are heated by radiant heat from the susceptor and ceiling (see Patent Documents 1 and 2). Thus, susceptors and ceilings made of graphite (carbon) are used since they are suitable for high-frequency induction heating.

However, in a CVD device, deposits of the SiC epitaxial layers are deposited not only on the surfaces of the SiC wafers, but also on the surface of the ceiling during film formation. As a result of repeating film formation, there were cases in which deposits deposited on the surface of the ceiling separated from the ceiling and fell onto the surfaces of the SiC wafers.

In this case, the film quality of the SiC epitaxial layers was significantly impaired due to the deposits (particles) adhered to the surfaces of the SiC epitaxial layers and the deposits (downfall) embedded in the SiC epitaxial layers.

This type of problem is particularly prominent in volume production-type CVD devices that repeatedly carry out film formation. Consequently, CVD devices require that cleaning work be periodically performed to remove deposits deposited on the ceiling and other locations inside the chamber.

However, since the size of the chamber is quite large in the case of volume production-type CVD devices, not only does the aforementioned cleaning work require considerable time, but unless this cleaning work is performed properly, the problem of conversely increasing the amounts of particles and downfall ends up occurring. Thus, it is essential to reduce the levels of the aforementioned particles and downfall in order to improve the product yield of SiC epitaxial wafers.

Therefore, in the invention described in Patent Document 2 indicated below, adhesion of deposits (particles) deposited on the ceiling to wafers as a result of falling onto the wafers is proposed to be prevented by a cover plate by arranging a cover plate for covering the wafers between the wafers mounted on the susceptor and the ceiling (top plate) opposing the susceptor.

However, in this case, although deposits deposited on the ceiling can be prevented from falling onto the wafers, since the deposition of deposits on the ceiling cannot be prevented, bothersome cleaning work is required for removing the aforementioned deposits deposited on the ceiling.

On the other hand, a CVD device has also been proposed that inhibits particle generation by composing the ceiling with a large-sized SiC single crystal material and improving the adhesion of deposits to the surface of this ceiling (see Patent Document 3).

However, since a ceiling composed of a large-sized SiC single crystal material is susceptible to warping and cracking by high-temperature heating during film formation, it is difficult to stably use such a ceiling composed of a large-sized SiC single crystal material for a long period of time. In addition, large-sized SiC single crystal materials are also extremely expensive and SiC single crystal substrates in excess of 4 inches are difficult to acquire, thereby resulting in problems in terms of fabricating the CVD device as well.

DOCUMENT OF RELATED ART

Patent Documents

Patent Document 1: Japanese Translation of PCT International Application Publication No. 2004-507897
Patent Document 2: Japanese Unexamined Patent Application, First Publication No. 2009-164162
Patent Document 3: Japanese Unexamined Patent Application, First Publication No. 2005-235845

Non-Patent Documents

Non-Patent Document 1: Materials Science Forum, Vols. 483-485 (2005), pp. 141-146
Non-Patent Document 2: Materials Science Forum, Vols. 556-557 (2007), pp. 57-60

SUMMARY OF INVENTION

Technical Problem

The present invention was proposed with the foregoing in view, and an object thereof is to provide an epitaxial wafer manufacturing device that enables high-quality epitaxial layers to be stably deposited and grown on the surfaces of wafers by reducing the levels of the aforementioned particles and downfall, and an epitaxial wafer manufacturing method capable of further improving product yield by using this manufacturing device.

Means for Solving the Problems

The present invention provides the means indicated below.

(1) An epitaxial wafer manufacturing device that deposits and grows epitaxial layers on the surfaces of heated wafers while supplying a raw material gas to a chamber, provided with:

a susceptor having a plurality of mounting portions on which the wafers are mounted, wherein the plurality of mounting portions are arranged in a row in the circumferential direction;

a top plate arranged in opposition to the upper surface of the susceptor so as to form a reaction space between the top plate and the susceptor;

a heating means arranged on the lower surface side of the susceptor and/or upper surface side of the top plate for heating the wafers mounted on the mounting portions;

a gas supply means having a gas inlet for introducing the raw material gas from a central portion of the upper surface of the top plate to the reaction space, that supplies raw material gas released from the gas inlet from the inside to the outside of the reaction space; and, a shield removably attached inside the chamber and arranged in close proximity to the lower surface of the top plate so as to prevent deposits from being deposited on the lower surface of the top plate; wherein, the shield has a substrate having an opening in the central portion thereof that forces the gas inlet to face the inside of the reaction space, and a thin film that covers the lower surface of this substrate, the surface of the thin film is in the shape of surface irregularities corresponding to fine surface irregularities formed in the lower surface of the substrate, and when the shield has undergone thermal deformation as a result of being heated by the heating means, deposits deposited on the lower surface of the shield are inhibited from falling off by the shape of the surface irregularities.

(2) The epitaxial wafer manufacturing device described in (1) above, wherein the height of the fine surface irregularities is within the range of 2 μm to 50 μm, the thickness of the thin film is within the range of 30 μm to 200 μm, and the interval between mutually adjacent convex portions of the fine surface irregularities is within the range of 50 μm to 150 μm.

(3) The epitaxial wafer manufacturing device described in (1) of (2) above, wherein the fine surface irregularities are formed on the surface of the substrate by carrying out any of texturing, lithography or transfer printing.

(4) The epitaxial wafer manufacturing device described in any of (1) to (3) above, provided with a sidewall located outside the susceptor and the top plate and arranged so as to surround the periphery of the reaction space, wherein a support portion for supporting the shield is provided on the inner peripheral surface of the sidewall.

(5) The epitaxial wafer manufacturing device described in (4) above, wherein the support portion is a step portion provided over the entire circumference on the inner peripheral surface of the sidewall, and supports the shield in a state in which the outer peripheral portion of the shield is mounted on this step portion.

(6) The epitaxial wafer manufacturing device described in any of (1) to (5) above, wherein the shield has a structure in which it is concentrically divided into a plurality of ring plates around the opening.

(7) The epitaxial wafer manufacturing device described in (6) above, wherein, among adjacent ring plates on both sides of each dividing line of the plurality of concentrically divided ring plates, an inner step portion provided on the outer peripheral portion on the lower surface side of the ring plate located to the inside of the dividing line, and an outer step portion provided on the inner peripheral portion on the upper surface side of the ring plate located to the outside of the dividing line, are engaged in a state in which their mutual step surfaces are in contact, and a gap is provided between the lateral surface of the inner step portion and the lateral surface of the outer step portion.

(8) The epitaxial wafer manufacturing device described in (6) or (7) above, wherein at least the lower surfaces of the plurality of concentrically divided ring plates are on the same plane.

(9) The epitaxial wafer manufacturing device described in any of (6) to (8) above, wherein the shield has a structure in which it is divided into an inner peripheral ring plate, a central ring plate and an outer peripheral ring plate moving from the inside to the outside, and a dividing line between the inner peripheral ring plate and the central ring plate is located farther to the inside than the region where the plurality of mounting portions are arranged in a row in the circumferential direction, and a dividing line between the central ring plate and the outer peripheral ring plate is located farther to the outside than the region where the plurality of mounting portions are arranged in a row in the circumferential direction.

(10) The epitaxial wafer manufacturing device described in any of (6) to (9) above, wherein the shield has a structure in which it is divided into an inner peripheral ring plate and an outer peripheral ring plate moving from the inside to the outside, and a dividing line between the inner peripheral ring plate and the outer peripheral ring plate is located farther to the inside or outside than the region where the plurality of mounting portions are arranged in a row in the circumferential direction.

(11) The epitaxial wafer manufacturing device described in (9) or (10) above, wherein the wafer is an SiC single crystal substrate and the epitaxial layer is an SiC single crystal thin film, and in an SiC deposit deposited on the lower surface of the shield, has a region where the ratio of Si is greater to the inside of a region where the ratios of Si and C contained in the SiC deposit are equal, and a dividing line between the inner peripheral ring plate and the central or outer peripheral ring plate is positioned so that the inner peripheral ring plate is arranged in this region where the ratio of Si is greater.

(12) The epitaxial wafer manufacturing device described in any of (6) to (11) above, wherein any of the ring plates among the plurality of concentrically divided ring plates is divided into a plurality of ring pieces along dividing lines extending in the radial direction centering on the opening.

(13) The epitaxial wafer manufacturing device described in any of (6) to (12) above, wherein the wafer is an SiC single crystal substrate and the epitaxial layer is an SiC single crystal thin film, and a graphite substrate coated with an SiC thin film on the surface thereof is at least used for the ring plate arranged at a location opposing the region where the plurality of mounting portions are arranged in a row in the circumferential direction.

(14) The epitaxial wafer manufacturing device described in any of (1) to (13) above, having a structure wherein the susceptor is driven to rotate about the central axis thereof and the plurality of mounting portions are driven to rotate about their respective central axes.

(15) An epitaxial wafer manufacturing method, comprising a step for depositing and growing epitaxial layers on the surfaces of wafers using the epitaxial wafer manufacturing device described in any of (1) to (14) above.

Effects of the Invention

As has been described above, in the epitaxial wafer manufacturing device according to the present invention, since a shield is arranged in close proximity to the lower surface of a top plate so as to prevent deposits from being deposited on the lower surface of the top plate, deposits are allowed to be deposited on the lower surface of this shield.

In this epitaxial wafer manufacturing device, a shield is removably attached inside a chamber. Consequently, the previously described particles and downfall can be reduced simply by carrying out simple maintenance work consisting of replacing the shield without having to carry out bothersome cleaning work for removing deposits deposited on the lower surface of the top plate as in the prior art.

Moreover, in this epitaxial wafer manufacturing device, the shield has a substrate having an opening in the central portion thereof that forces a gas inlet to face the inside of the reaction space and a thin film that covers the lower surface of this substrate. In addition, the surface of the thin film is in the shape of surface irregularities corresponding to fine surface irregularities formed in the lower surface of the substrate. Corresponding surface irregularities means that the lower surface of the thin film has nearly the same shape as the lower surface of the substrate.

In this case, among deposits deposited on the lower surface of the shield (surface of the thin film), the growth rate of deposits deposited on each convex portion is increased more than the growth rate of deposits deposited on each concave portion in the shape of surface irregularities. In addition, since the distance between convex portions can be controlled by the presence of concave portions of a specific width, when the shield has undergone thermal deformation as a result of being heated by the heating means, collision of deposits deposited and grown using each convex portion as a starting point between mutually adjacent convex portions on both sides of the concave portions is avoided. As a result, deposits deposited on the lower surface of the shield can be inhibited from falling off.

In addition, in the epitaxial wafer manufacturing device according to the present invention, preferably the height of the fine surface irregularities is preferably within the range of 2 µm to 50 µm, the thickness of the thin film is within the range of 30 µm to 200 µm and the interval between mutually adjacent convex portions of the surface irregularities is within the range of 50 µm to 150 µm, and more preferably, the height of the fine surface irregularities is within the range of 2 µm to 30 µm, the thickness of the thin film is within the range of 30 µm to 100 µm, and the interval between mutually adjacent convex portions of the surface irregularities is within the range of 70 µm to 140 µm.

As a result, when the shield has undergone thermal deformation as a result of being heated by the heating means, deposits deposited on the lower surface of the shield can be inhibited from falling off.

In addition, the aforementioned fine surface irregularities can be formed by carrying out any of texturing, lithography or transfer printing on the surface of the substrate.

In addition, in the epitaxial wafer manufacturing device according to the present invention, a configuration may also be employed in which, in addition to providing a sidewall located outside the susceptor and top plate and arranged so as to surround the periphery of a reaction space, the shield is supported by a support portion provided on the inner peripheral surface of this sidewall.

In this case of this configuration, as a result of only supporting the outer peripheral portion of the shield, the shield can be removably attached inside the chamber while avoiding contact between a gas inlet at a low temperature due to the introduction of raw material gas and the inner peripheral portion of the shield (central portion where an opening is formed) at a high temperature as a result of being heated by the heating means.

Moreover, in the epitaxial wafer manufacturing device according to the present invention, a configuration may be employed in which a step portion is provided for the aforementioned step portion over the entire circumference on the inner peripheral surface of the sidewall, and supports the shield in a state in which the outer peripheral portion of the shield is mounted on this step portion.

In the case of this configuration, as a result of the outer peripheral portion of the shield being in contact with the step portion over the entire circumference thereof, inflow of gas from the outer peripheral portion side of this shield towards the space between the shield and the top plate can be prevented.

In addition, in the epitaxial wafer manufacturing device according to the present invention, a configuration may be employed in which the aforementioned shield has a structure in which it is concentrically divided into a plurality of ring plates around an opening.

In the case of this configuration, thermal stress acting on the shield can be alleviated among the concentrically divided ring plates. As a result, the occurrence of warping (deformation) or cracking and the like in the shield divided into a plurality of ring plates can be prevented. In addition, as a result of preventing the occurrence of warping (deformation) and cracking of the shield, deposits deposited on the lower surface of the shield can be inhibited from falling off. Moreover, it is possible to only replace a portion of the ring plates in the shield divided into a plurality of ring plates.

In addition, in the epitaxial wafer manufacturing device according to the present invention, among adjacent ring plates on both sides of each dividing line of a plurality of concentrically divided ring plates, an inner step portion provided on the outer peripheral portion on the lower surface side of the ring plate located to the inside of a dividing line, and an outer step portion provided on the inner peripheral portion on the upper surface side of the ring plate located to the outside of the dividing line, are engaged in a state in which their mutual step surfaces are in contact, and a gap is provided between the lateral surface of the inner step portion and the lateral surface of the outer step portion.

In the case of this configuration, the outer peripheral portion of the ring plate located to the inside of the dividing line can be supported by the inner peripheral portion of the ring plate located to the outside of the dividing line as a result of the inner step portion and outer step portion engaging.

In addition, by providing a gap between the lateral surface of the inner step portion and the lateral surface of the outer step portion, contact between lateral surfaces of adjacent ring plates on both sides of a dividing line can be prevented when the shield has undergone thermal expansion as a result of being heated by the heating means.

In addition, in the epitaxial wafer manufacturing device according to the present invention, a configuration may be employed in which at least the lower surfaces of the plurality of concentrically divided ring plates are on the same plane.

In the case of this configuration, since at least the lower surfaces of the plurality of concentrically divided ring plates are on the same plane, high-quality epitaxial layers can be stably deposited and grown on the surfaces of wafers while smoothly supplying a raw material gas released from a gas inlet from the inside to the outside of a reaction space.

In addition, in the epitaxial wafer manufacturing device according to the present invention, in a configuration having a structure in which the aforementioned shield is divided into an inner peripheral ring plate, a central ring plate and an outer peripheral ring plate moving from the inside to the outside, a dividing line between the inner peripheral ring plate and the central ring plate is located farther to the inside than a region where the plurality of mounting portions are arranged in a row in the circumferential direction, and a dividing line between the central ring plate and the outer peripheral ring plate is located farther to the outside than the region where the plurality of mounting portions are arranged in a row in the circumferential direction.

In this case of this configuration, as a result of dividing the shield into three sections consisting of an inner peripheral ring plate, a central ring plate and an outer peripheral ring plate, thermal stress acting on the shield can be alleviated among these three divided ring plates. In particular, as a result of positioning the dividing line between the inner peripheral ring plate and the central ring plate farther to the inside than the region where the plurality of mounting portions are arranged in a row in the circumferential direction, while positioning the dividing line between the central ring plate and the outer peripheral ring plate farther to the outside than the region where the plurality of mounting portions are arranged in a row in the circumferential direction, thermal stress acting on the inner peripheral side and outer peripheral side of the shield, where there are particularly large changes in heat, can be efficiently alleviated.

In addition, in the epitaxial wafer manufacturing device according to the present invention, in a configuration in which the aforementioned shield has a structure in which it is divided into an inner peripheral ring plate and an outer peripheral ring plate moving from the inside to the outside, a dividing line between the inner peripheral ring plate and the outer peripheral ring plate is located farther to the inside or outside than the region where the plurality of mounting portions are arranged in a row in the circumferential direction.

In the case of this configuration, as a result of dividing the shield into two sections consisting of an inner peripheral ring plate and outer peripheral ring plate, thermal stress acting on the shield can be alleviated between these two divided ring plates. In particular, as a result of positioning the dividing line between the inner peripheral ring plate and the outer peripheral ring plate farther to the inside than the region where the plurality of mounting portions are arranged in a row in the circumferential direction, thermal stress acting on the inner peripheral side of the shield, where there are particularly large changes in heat, can be efficiently alleviated. On the other hand, as a result of positioning the dividing line between the inner peripheral ring plate and the outer peripheral ring plate farther to the outside than the region where the plurality of mounting portions are arranged in a row in the circumferential direction, thermal stress acting on the outer peripheral side of the shield, where there are particularly large changes in heat, can be efficiently alleviated.

In addition, in the epitaxial wafer manufacturing device according to the present invention, a configuration may be employed in which, in the case the wafer is an SiC single crystal substrate and the epitaxial layer is an SiC single crystal thin film, in an SiC deposit deposited on the lower surface of the shield, there is a region where the ratio of Si is greater to the inside of a region where the ratios of Si and C contained in the SiC deposit are equal, and a dividing line between the inner peripheral ring plate and the central or outer peripheral ring plate is positioned so that the inner peripheral ring plate is arranged in this region where the ratio of Si is greater.

In the case of this configuration, the growth of SiC deposits is faster in the region where the ratio of Si is greater than the region where the ratios of Si and C are equal. Thus, the times at which other ring plates are replaced can be extended by replacing only the inner peripheral ring plate of the shield divided into a plurality of ring plates that is arranged in this region where the ratio of Si is greater.

In addition, in the epitaxial wafer manufacturing device according to the present invention, a configuration may be employed in which any of the ring plates among the plurality of concentrically divided ring plates is divided into a plurality of ring pieces along dividing lines extending in the radial direction centering on an opening.

In the case of this configuration, as a result of dividing a ring plate that composes the shield into a plurality of ring pieces, thermal stress acting on the shield can be alleviated among these divided ring pieces.

In addition, in the epitaxial wafer manufacturing device according to the present invention, in the case the wafer is an SiC single crystal substrate and the epitaxial layer is an SiC single crystal thin film, a graphite substrate coated with an SiC film on the surface thereof or an SiC substrate is at least used for the ring plate arranged at a location opposing the region where the plurality of mounting portions are arranged in a row in the circumferential direction.

In the case of this configuration, as a result of the same SiC as the epitaxial layer being used for the surface of the aforementioned ring plate, depositability of deposits can be enhanced and deposits deposited on the lower surface of this ring plate can be inhibited from falling off. In addition, the time at which the aforementioned ring plate is replaced can be extended.

In addition, in the epitaxial wafer manufacturing device according to the present invention, a configuration may be employed having a structure in which, in addition to a susceptor being driven to rotate about the central axis thereof, a plurality of mounting portions are driven to rotate about their respective central axes.

In the case of this configuration, a step for depositing and growing epitaxial layers on the surfaces of wafers can be carried out uniformly for each wafer mounted on a plurality of mounting portions.

In addition, in the epitaxial wafer manufacturing method according to the present invention, high-quality epitaxial layers can be stably deposited and grown on the surfaces of wafers by using any of the epitaxial wafer manufacturing devices described above. Since the amount of time spent on maintenance can be shortened, the product yield of epitaxial wafers can be further improved.

BRIEF DESCRIPTION OF DRAWINGS

FIG. 8 is an overhead view showing a variation of a shield.

DESCRIPTION OF EMBODIMENTS

The following provides a detailed explanation of the epitaxial wafer manufacturing device and method to which the present invention is applied with reference to the drawings.

The drawings used in the following explanation may be shown with those characteristic portions suitably enlarged in order to facilitate the understanding of those characteristics, and therefore the dimensional ratios of each constituent feature are not necessarily the same as actual ratios. In addition, the materials, dimensions and the like exemplified in the following explanation are merely examples, and the present invention is not necessarily limited thereto and can be carried out by suitably modifying within a range that does not deviate from the gist thereof.

Example 1

Epitaxial Wafer Manufacturing Device

First Embodiment

Figure 1:
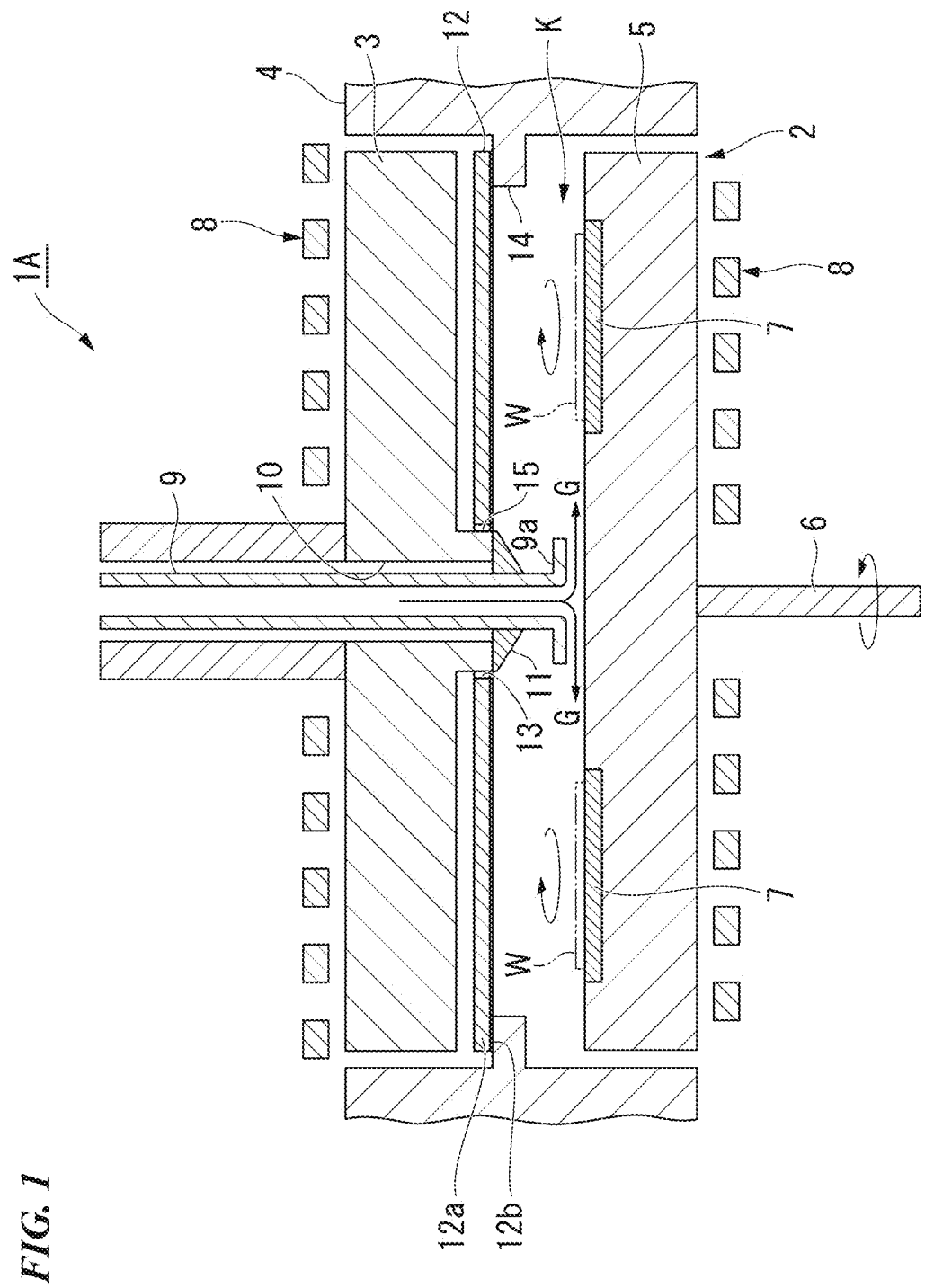
FIG. 1 is a cross-sectional schematic diagram of a CVD device indicated as a first embodiment of the present invention.

An explanation is first provided regarding a CVD device (epitaxial wafer manufacturing device) 1A shown in FIG. 1 as a first embodiment of the present invention.

This CVD device 1A deposits and grows SiC epitaxial layers (not shown) on the surfaces of heated SiC wafers W while supplying an SiC raw material gas G to a chamber (film formation chamber) capable of depressurization and evacuation not shown in the drawings. The raw material gas G can be suitably selected, and for example, that containing silane ($SiH_4$) for the Si source and propane ($C_3H_8$) for the C source can be used, while that containing hydrogen ($H_2$) can be used as a carrier gas.

More specifically, this CVD device 1A is provided with a susceptor 2 on which is mounted a plurality of SiC wafers W, a ceiling (top plate) 3 arranged in opposition to the upper surface of the susceptor 2 so as to form a reaction space K between the ceiling 3 and the susceptor 2, and a sidewall 4 located outside the susceptor 2 and the ceiling 3 and arranged so as to surround the periphery of the reaction space K, all within the chamber.

The susceptor 2 has a disc-shaped turntable 5 and a rotating shaft 6 attached to a central portion of the lower surface of the turntable 5, and the turntable 5 is supported to rotate freely while integrated into a single unit with the rotating shaft 6. In addition, disc-shaped mounting stands (mounting portions) 7 on which the SiC wafers W are mounted are provided on the upper surface of the turntable 5.

A plurality of the mounting stands 7 are provided arranged in a row at equal intervals in the circumferential direction (rotating direction) of the turntable 5. In addition, each mounting stand 7 is supported to as to rotate freely about its respective central axis. The susceptor 2 employs a so-called planetary (rotary and revolutionary motion) system, and a mechanism is employed such that, when the rotating shaft 6 is driven to rotate by a drive motor not shown in the drawings, in addition to the turntable 5 being driven to rotate around the central axis thereof, each of the plurality of mounting stands 7 is driven to rotate about its respective central axis. As a result, film formation can be carried out uniformly on each SiC wafer W mounted on the plurality of mounting stands 7.

The ceiling 3 is a disc-shaped member having a diameter that roughly coincides with the turntable 5 of the aforementioned susceptor 2, and forms the flat reaction space K with the susceptor 2 while opposing the upper surface of the turntable 5. The sidewall 4 is a ring-shaped member that surrounds the outer peripheral portions of the susceptor 2 and the ceiling 3.

The CVD device 1A is provided with heating means for heating the SiC wafers W mounted on the aforementioned mounting stands 7 in the form of induction coils 8 for heating the susceptor 2 and the ceiling 3 by high-frequency induction heating. These heating coils 8 are arranged in opposition in close proximity to the lower surface of the susceptor 2 (turntable 5) and upper surface of the ceiling 3, respectively.

In this CVD device 1A, when high-frequency current is supplied to the induction coils 8 from a high-frequency power supply not shown in the drawings, the susceptor 2 (turntable 5 and mounting stands 7) and the ceiling 3 are heated by high-frequency induction heating, thereby enabling the SiC wafers W mounted on the mounting stands 7 to be heated by radiant heat from the susceptor 2 and the ceiling 3 and by conductive heat from the mounting stands 7.

A graphite (carbon) material having superior heat resistance and favorable thermal conductivity can be used as a material suitable for high-frequency induction heating in the susceptor 2 (turntable 5 and mounting stands 7) and the ceiling 3, and a member coated with SiC or TaC and the like on the surface thereof can be used preferably in order to prevent the generation of particles from the graphite (carbon). In addition, the heating means of the SiC wafers W is not limited to the aforementioned high-frequency inducting heating, but rather a member heated by resistance heating and the like may also be used. In addition, the heating means are not limited to a configuration in which they are arranged on the lower surface side of the susceptor 2 (turntable 5) and upper surface side of the ceiling 3, but rather a configuration can also be employed in which the heating means are arranged on only one of either of these sides.

The CVD device 1A is provided with a gas supply means that supplies the raw material gas G to the chamber in the form of a gas introduction pipe (gas inlet) 9 that introduces the raw material gas G into the reaction space K from the central portion of the upper surface of the ceiling 3. This gas introduction pipe 9 is formed into a cylindrical shape, and is arranged with the leading end portion (lower end portion) thereof facing the inside of the reaction space K in a state in which it passes through a circular opening 10 provided in the central portion of the ceiling 3.

In addition, a flange portion 9a protruding outwardly in the radial direction is provided on the leading end portion (lower end portion) of the gas introduction pipe 9. This flange portion 9a causes the raw material gas G that has been released vertically downward from the lower end portion of the gas introduction pipe 9 to flow radially in the horizontal direction between the ceiling 3 and the opposing turntable 5.

In this CVD device 1A, as a result of the raw material gas G released from the gas introduction pipe 9 flowing radially from the inside to the outside of the reaction space K, the raw material gas G can be supplied parallel to the surfaces of the SiC wafers W. In addition, gas that is no longer required in the chamber can be evacuated outside the chamber from an exhaust port (not shown) provided in the outside of the aforementioned sidewall 4.

Here, although the ceiling 3 is heated at a high temperature by the aforementioned induction coils 8, the inner peripheral portion thereof (central portion where the opening 10 is formed) does not make contact with the gas introduction pipe 9 that is at a low temperature due to the introduction of the raw material gas G. In addition, the ceiling 3 is supported vertically upward as a result of the inner peripheral portion thereof being mounted on a support ring (support member) 11 attached to the outer peripheral portion of the gas introduction pipe 9. Moreover, this ceiling 3 can be moved in the vertical direction.

The CVD device 1A is provided with a shield 12 arranged in close proximity to the lower surface of the ceiling 3. This shield 12 is composed of a disc-shaped substrate made of graphite (carbon) and an SiC thin film 12b that covers the lower surface of this substrate 12a. In addition, a circular opening 13 through which the aforementioned gas introduction pipe 9 passes is provided in the central portion of the shield 12 (substrate 12a).

This shield 12 is removably attached inside the chamber. More specifically, this shield 12 is supported vertically upward as a result of the outer peripheral portion thereof being mounted on a support portion 14 provided protruding from the inner peripheral surface of the sidewall 4. In this case, as a result of supporting only the outer peripheral portion of the shield 12, the shield 12 can be removably attached within the chamber while avoiding contact between the gas introduction pipe 9 at a low temperature due to introduction of the raw material gas G and the inner peripheral portion (central portion where the opening 13 is formed) of the shield 12 at a high temperature as a result of being heated by the aforementioned induction coils 8.

In addition, the support portion 14 is a step portion provided over the entire circumference of the inner peripheral surface of the sidewall 4, and the outer peripheral portion of the shield 12 is mounted on this step portion. In this case, since the outer peripheral portion of the shield 12 makes contact over the entire circumference of the support portion (step portion) 14, gas can be prevented from flowing in from the outer peripheral portion side of the shield 12 towards the space between the shield 12 and the ceiling 3.

On the other hand, a cylindrical sleeve portion 15 is provided protruding from the central portion of the lower surface of the ceiling 3 so as to be positioned inside the opening 13 of the aforementioned shield 12. This sleeve portion 15 makes it difficult for gas to flow in from the inner peripheral portion side of the shield 12 towards the space between the shield 12 and the ceiling 3.

Figure 2:
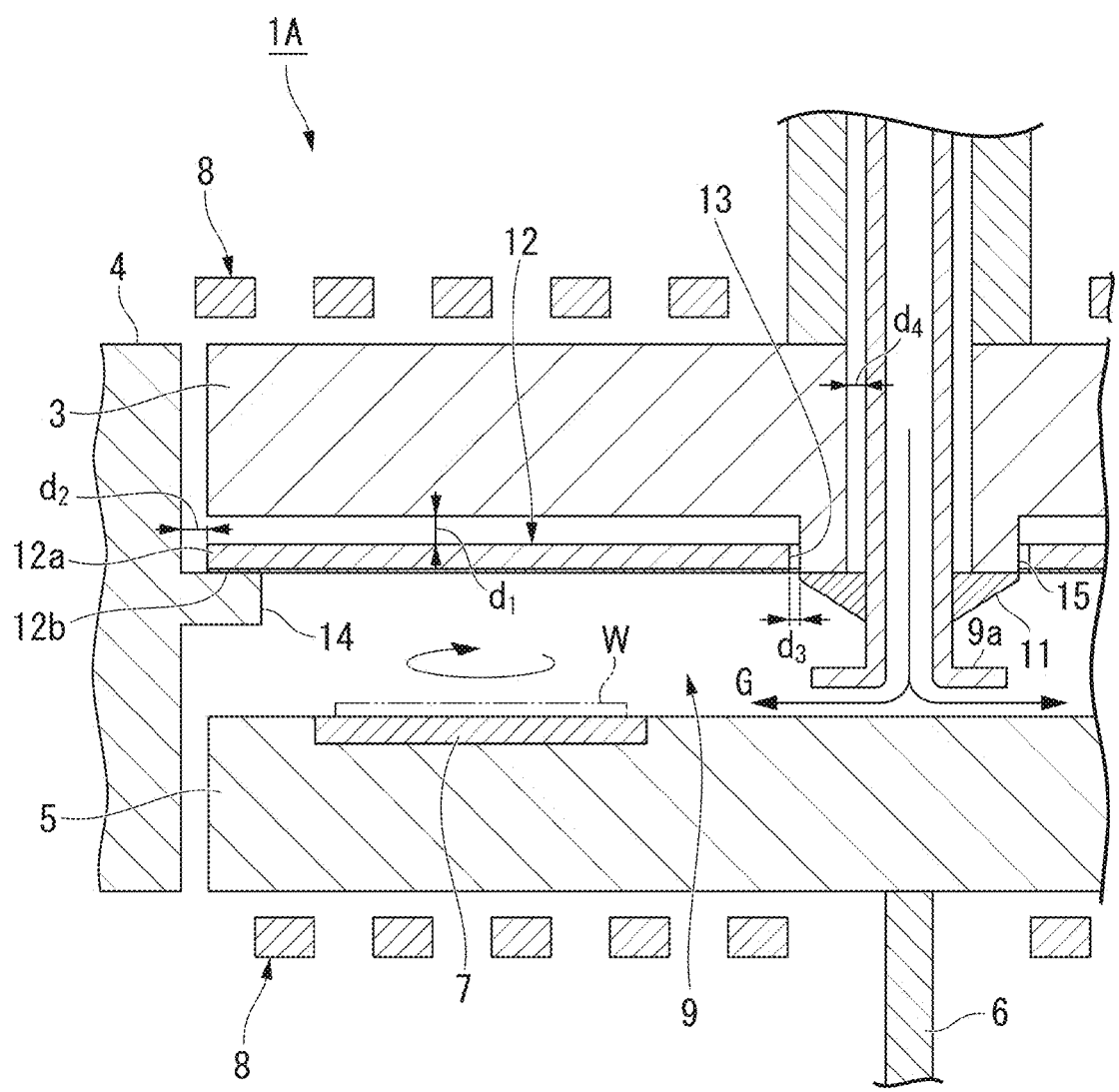
FIG. 2 is a cross-sectional schematic diagram showing an enlarged view of the essential portions of the CVD device shown in FIG. 1.

Here, as shown in FIG. 2, although a gap $d_1$ between the upper surface of the shield 12 and the lower surface of the ceiling 3 is set as required, it is preferably set to a range of 0.5 mm to 1 mm. This is to allow the shield 12 to prevent deposits of SiC from being deposited on the lower surface of the ceiling 3.

In addition, although a gap $d_2$ between the outer peripheral surface of the shield 12 and the inner peripheral surface of the sidewall 4 is set as required, it is preferably set to a range of 1.0 mm to 3.0 mm. This is to prevent the shield 12 from contacting the sidewall 4 due to thermal expansion during heating.

In addition, although a gap $d_3$ between the inner peripheral surface of the shield 12 and the outer peripheral surface of the sleeve portion 15 is set as required, it is preferably set to a range of 0.5 mm to 1 mm. This is for making it difficult for gas to flow in from the inner peripheral portion side of the shield 12 towards the space between the shield 12 and the ceiling 3 while preventing the shield 12 from contacting the sleeve portion 15 due to thermal expansion during heating.

In addition, although a gap $d_4$ between the inner peripheral surface of the ceiling 3 and the outer peripheral surface of the gas introduction pipe 9 is set as required, it is preferably set to a range of 0.4 mm to 0.6 mm. This is to prevent the gas introduction pipe 9 at a low temperature due to introduction of the raw material gas G from being affected by radiant heat from the ceiling 3 at a high temperature as a result of being heated by the aforementioned induction coils 8.

In addition, although the thickness of the shield 12 is set as required and a greater thickness is preferable for securing the mechanical strength thereof, since cracking conversely occurs if the shield 12 is excessively thick, the thickness is preferably within a range of 2 mm to 6 mm.

In the CVD device 1A having a structure like that described above, in addition to the turntable 5 being driven to rotate about the central axis thereof, the plurality of mounting stands 7 are driven to rotate about their respective central axes. In addition, while in this state, the raw material gas G released from the gas introduction pipe 9 is forced to radially flow from the inside to the outside of the reaction space K while heating the SiC wafers W mounted on the mounting stands 7. As a result, the raw material gas G is supplied parallel to the surfaces of the SiC wafers W. At this time, SiC epitaxial layers are grown while depositing on the surfaces of the SiC wafers by thermal decomposition and chemical reaction of the raw material gas G. As a result, SiC epitaxial layers can be formed in the form of thin films on the surfaces of the SiC wafers W.

In the CVD device 1A to which the present invention is applied, the shield 12 is arranged in close proximity to the lower surface of the ceiling 3 so as to prevent deposits from being deposited on the lower surface of the ceiling 3 as was previously described. As a result, deposits are deposited on the lower surface of the shield 12.

In this CVD device 1A, since the shield 12 is removably attached inside the chamber, the aforementioned particles and downfall can be reduced simply by carrying out simple maintenance work consisting of replacing the shield without having to carry out the bothersome cleaning work of removing deposits deposited on the lower surface of the ceiling 3 as in the prior art.

When replacing the shield 12, the shield 12 located to the inside of the aforementioned sidewall 4 can be easily removed or attached by moving the aforementioned ceiling 3 vertically.

However, although the shield 12 is heated to a high temperature by the induction coils 8, cool raw material gas G is supplied from the gas introduction pipe 9 from the inside to the outside of the reaction space K. Consequently, the temperature on the lower surface side of the shield 12 tends to be lower than the temperature on the upper surface side. In addition, since the gas introduction pipe 9 is at a low temperature, the temperature of the inner peripheral portion (central portion where the opening 13 is formed) of the shield 12 tends to become low. Moreover, since it is difficult for heat generated by the induction coils 8 to act on the inner peripheral portion and outer peripheral portion of the shield 12, the temperature is highest in the central portion thereof in the radial direction, and the temperature tends to become lower moving from this central portion toward both ends of the inner peripheral side and outer peripheral side.

Thus, warping (thermal deformation) occurs in the shield 12 that causes it to bend upward due to this difference in temperature distribution. At this time, since deposits deposited on the lower surface of the shield 12 approach each other, there is the possibility of these deposits colliding and suddenly falling from the shield 12.

In response thereto, in the CVD device 1A to which the present invention is applied, the lower surface of the shield 12, namely the upper and lower surface of the thin film 12b, is in the shape of surface irregularities 32 corresponding to fine surface irregularities 31 formed on the lower surface of the substrate 12a resulting in a structure in which deposits deposited on the lower surface of the shield 12 are inhibited from falling off by the shape of these surface irregularities 32.

More specifically, the fine surface irregularities have linear projections (convex portions) 31a having sharply angled peaks. Namely, the thin film 12b is provided in a zigzag shape on the lower surface of the shield 12 having a surface having a zigzag shape for the cross-section thereof. A plurality of the projections 31a is formed in a row in the form of a lattice within the plane of the substrate 12a. Linear concave portions 31b having the opposite shape from that of the projections 31a, namely sharply angled bottoms, are formed between each of the projections. In addition, the interval between each of the projections (convex portions) 31a and concave portions 31b is mutually equal. These fine surface irregularities 31 can be formed on the surface of the substrate 12a by a method such as texturing, lithography or transfer printing.

The shape of the surface irregularities 32 has projections (convex portions) 32a and concave portions 32b there between corresponding to the fine surface irregularities 31. The peaks of these projections (convex portions) 32a and the bottoms of the concave portions 32b respectively have a rounded shape instead of being sharply angled in consideration of the thin film 12b that covers the surface on which the fine surface irregularities 31 of the substrate 12a are formed.

Figure 4:
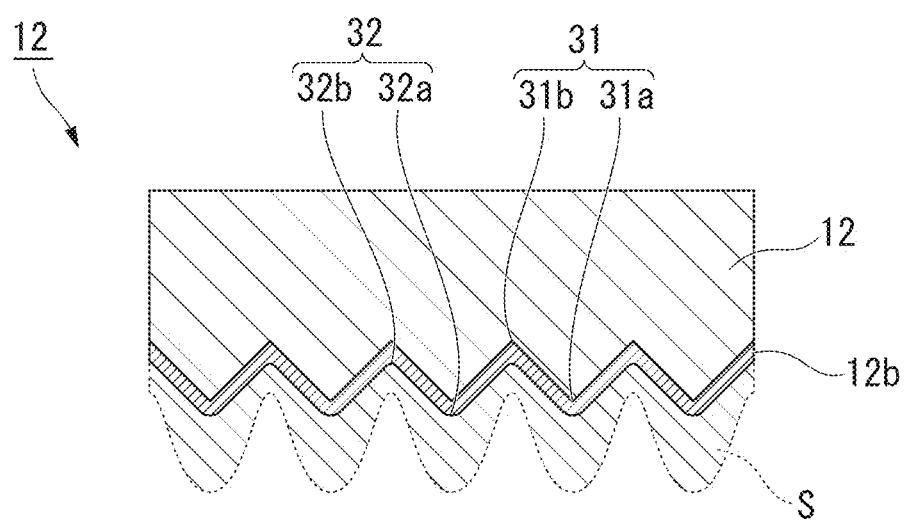
FIG. 4 is a cross-sectional view schematically showing the state of deposits deposited on the lower surface of a shield.

Here, as schematically shown in FIG. 4, deposits S tend to be easily deposited moving from the bottoms of the convex portions 32b forming the shape of the surface irregularities 32 towards the peaks of the convex portions 32a on the lower surface of the shield 12 (surface of the SiC thin film 12b). Namely, among the deposits S deposited on the lower surface of the shield 12 (surface of the SiC thin film 12b), the growth rate of deposits S deposited on each of the convex portions 32a of the shape of the surface irregularities 32 is faster than the growth rate of the deposits S deposited on each of the concave portions 32b. As a result, the thickness of the deposits S deposited on the lower surface of the shield 12 is greater on the surface of the convex portions 32a than on the surface of the concave portions 32b.

In the present invention, on the basis of these findings, fine surface irregularities 31 are formed on the substrate 12a so as to avoid collision of those deposits S deposited on the lower surface of the shield 12, which were deposited and grown by using each of the convex portions 32a of the shape of the surface irregularities 32 as starting points, between mutually adjacent convex portions 32a on both sides of the concave portions 32b. As a result of the shape of these surface irregularities 32 corresponding to the fine surface irregularities 31 being formed on the surface of the SiC thin film 12b, even in the case warping occurs in the shield 12 as previously described, deposits S deposited on the lower surface of the shield 12 (surface of the SiC thin film 12b) were found to be able to be inhibited from falling off, thereby leading to completion of the present invention.

Figure 3A:
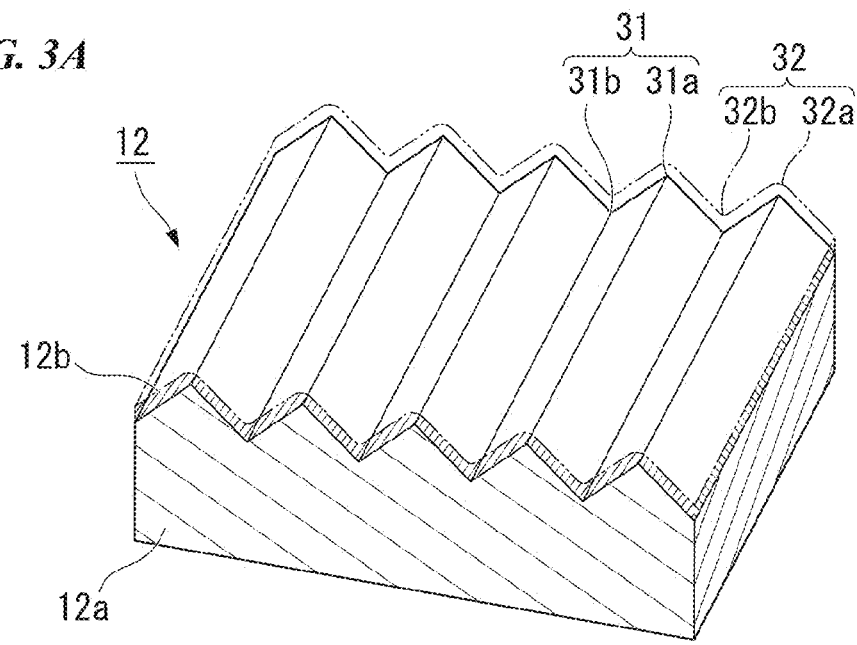
FIG. 3A is a partial perspective view of the aforementioned shield of the present invention.
Figure 3B:
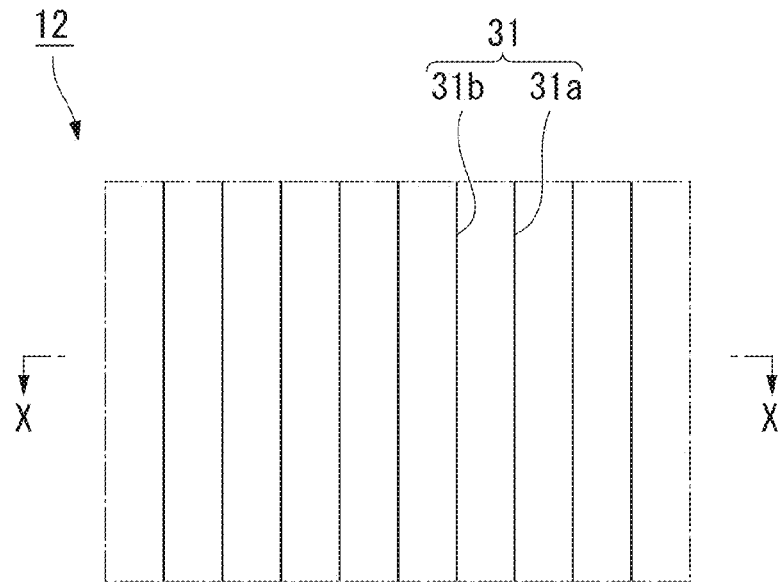
FIG. 3B is a partial overhead view of a shield.
Figure 3C:
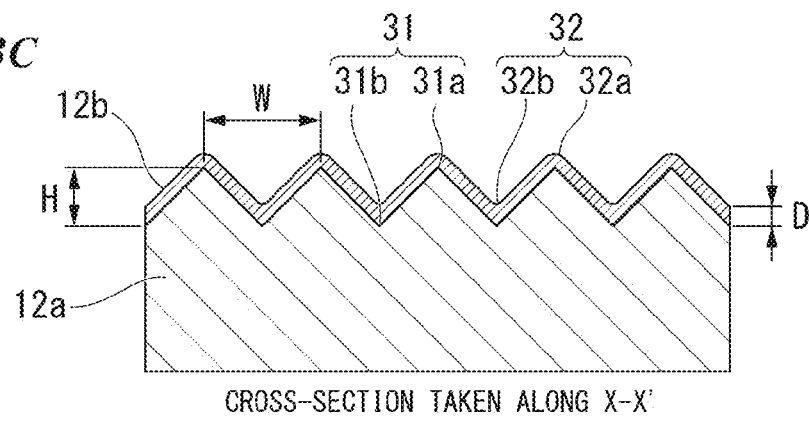
FIG. 3C is a cross-sectional view of a shield.

More specifically, in the present invention, as shown in FIG. 3C, the height H of the fine surface irregularities 31 (height difference between the convex portions 31a and the concave portions 31b) is preferably within the range of 2 μm to 50 μm, the thickness of the thin film 12b is preferably within the range of 30 μm to 200 μm, and the interval W between mutually adjacent convex portions 31a of the fine surface irregularities 31 is preferably within the range of 50 μm to 150 μm.

As a result, depositability (adhesion and growth rate) of the deposits S at those portions where the convex portions 32a are formed on the surface of the SiC thin film 12b can be enhanced, thereby making it difficult for the deposits S deposited at those portions to fall off.

As has been described above, in the CVD device 1A to which the present invention is applied, when the shield 12 has undergone thermal deformation as a result of being heated by the aforementioned induction coils 8, since collision of those deposits S deposited on the lower surface of the shield 12 (surface of the SiC thin film 12b), which were deposited and grown by using each of the convex portions 32a of the shape of the surface irregularities 32 as starting points, is avoided between mutually adjacent convex portions 32a on both sides of the concave portions 32b, the deposits S deposited on the lower surface of the shield 12 can be inhibited from falling off.

The present invention is not necessarily limited to the aforementioned first embodiment, but rather various modifications can be added within a range that does not deviate from the gist of the present invention. In addition, in the following explanation, in addition to omitting explanations of those sites that are the same as those of the aforementioned CVD device 1A, the same reference symbols are used to represent those sites that are the same as in the aforementioned CVD device 1A.

For example, a configuration may be employed in which the aforementioned fine surface irregularities 31 are formed by arranging in a row a plurality of projections (convex portions) 31a having sharply angled peaks, although not limited thereto. For example, a configuration can also be employed in which the aforementioned fine surface irregularities 31 are formed by arranging in a row a plurality of protrusions (convex portions) 31a having flat peaks. Specific examples thereof include those having a trapezoidal shape in which the top side is shorter instead of triangular shape for the cross-section thereof.

In this case as well, the depositability (adhesion and growth rate) of deposits at those portions where the protrusions are formed on the surface of the thin film 12b can be enhanced, thereby making it difficult for the deposits S deposited at those portions to fall off.

Figure 5A:
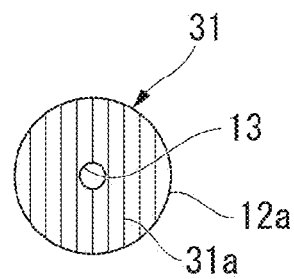
FIG. 5A is an overhead view exemplifying the direction in which fine surface irregularities are formed on the shield of the present invention.

In addition, FIGS. 5A to 5E are overhead views exemplifying directions in which the fine surface irregularities 31 of the shield 12 of the present invention are formed, namely patterns formed by the convex portions 31a and the concave portions 31b. Among these examples, FIG. 5A schematically indicates a configuration in which the aforementioned convex portions 31a are formed so as to be arranged in the form of a lattice in a single direction within the plane of the substrate 12a in the same manner as the shield 12 shown in the aforementioned FIGS. 3A to 3C. In this case of this configuration, the aforementioned effect of inhibiting deposits from falling off can be enhanced.

Figure 5B:
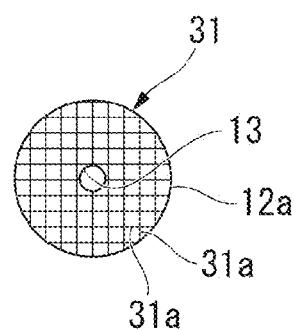
FIG. 5B is an overhead view exemplifying the direction in which fine surface irregularities are formed on the shield of the present invention.

On the other hand, FIG. 5B schematically shows a configuration in which, in addition to the configuration shown in the aforementioned FIG. 5A, the aforementioned convex portions 31a are formed so as to be arranged in the form of a lattice in an additional direction that intersects a single direction within the plane of the substrate 12a. In the case of this configuration as well, the aforementioned effect of inhibiting deposits from falling off can be enhanced.

Figure 5C:
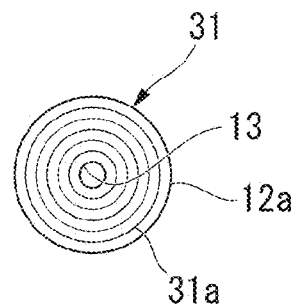
FIG. 5C is an overhead view exemplifying the direction in which fine surface irregularities are formed on the shield of the present invention.

On the other hand, FIG. 5C schematically indicates a configuration in which the aforementioned convex portions 31a are formed so as to be concentrically arranged centering on the opening 13. In the case of this configuration, since the direction in which warping of the shield 12 occurs as previously described can be made to coincide with the direction in which protrusions or the projections 31a are arranged, the aforementioned effect of inhibiting deposits from falling off can be enhanced.

Figure 5D:
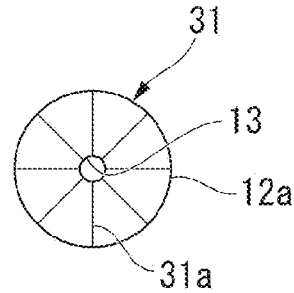
FIG. 5D is an overhead view exemplifying the direction in which fine surface irregularities are formed on the shield of the present invention.

On the other hand, FIG. 5D schematically indicates a configuration in which the aforementioned convex portions 31a are formed so as to be arranged radially centering on the opening 13. In the case of this configuration, the aforementioned effect of inhibiting deposits from falling off can be enhanced.

Figure 5E:
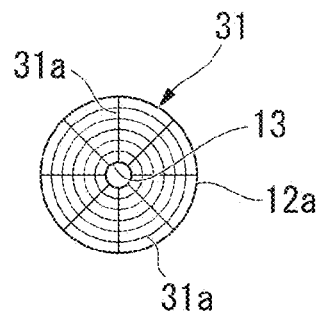
FIG. 5E is an overhead view exemplifying the direction in which fine surface irregularities are formed on the shield of the present invention.

On the other hand, FIG. 5E schematically indicates a configuration in which, in addition to the configuration shown in FIG. 5C, the aforementioned convex portions 31a are further formed to as to be radially arranged centering on the opening 13. In the case of this configuration as well, the aforementioned effect of inhibiting deposits from falling off can be enhanced.

Second Embodiment

Figure 6:
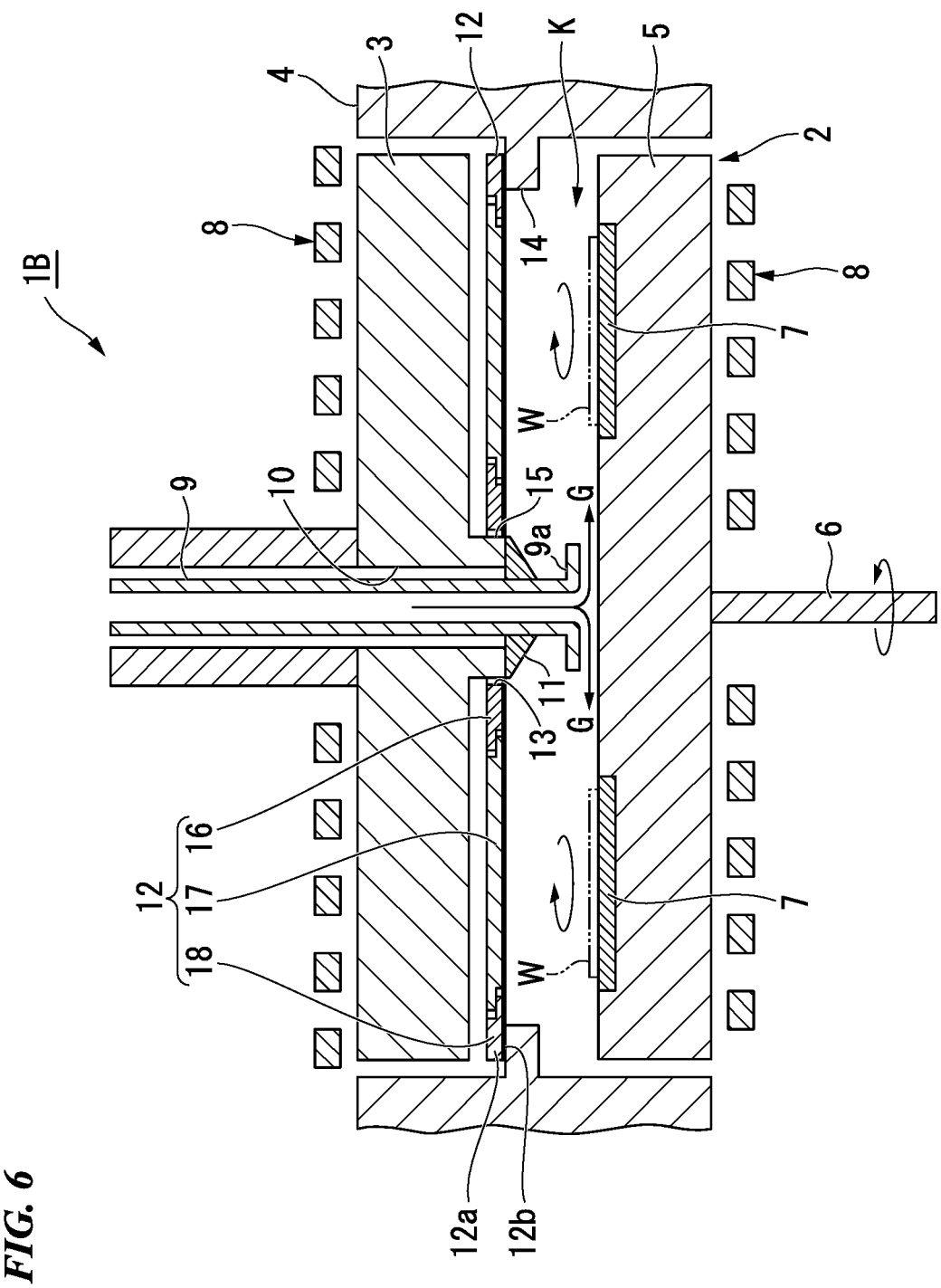
FIG. 6 is a cross-sectional schematic diagram of a CVD device indicated as a second embodiment of the present invention.

Next, an explanation is provided of a CVD device (epitaxial layer manufacturing device) 1B shown in FIG. 6 as a second embodiment of the present invention.

In the following explanation, in addition to omitting explanations of those sites that are the same as those of the aforementioned CVD device 1A, the same reference symbols are used to represent those sites that are the same as in the aforementioned CVD device 1A.

This CVD device 1B is provided with the same configuration as that of the aforementioned CVD device 1A with the exception of having a structure in which the aforementioned shield 12 is concentrically divided into a plurality of ring plates 16, 17 and 18 around the opening 13.

Figure 7A:
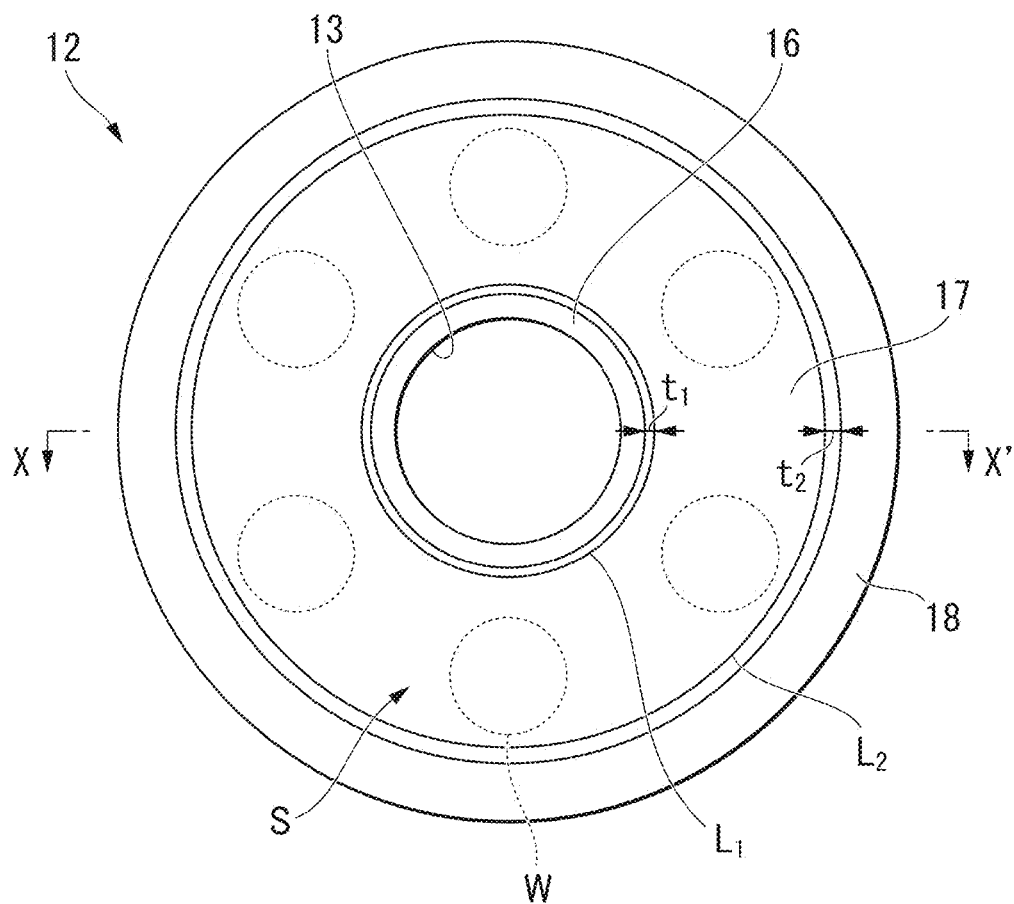
FIG. 7A is an overhead view of a shield divided into three sections.
Figure 7B:
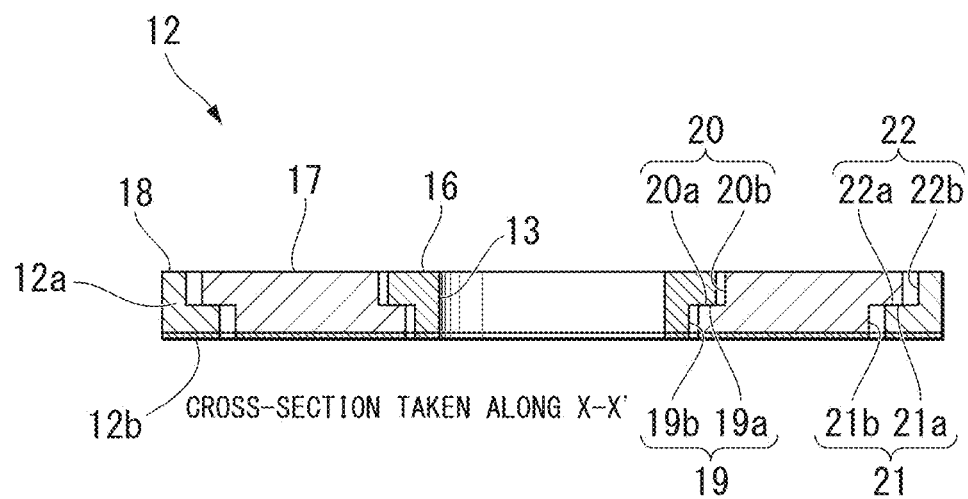
FIG. 7B is a cross-sectional view of the aforementioned shield divided into three sections.

More specifically, as shown in FIGS. 7A and 7B, the shield 12 has a structure in which it is divided into three sections consisting of the inner peripheral ring plate 16, the central ring plate 17 and the outer peripheral ring plate 18 moving from the inside towards the outside thereof.

Among these ring plates, the inner peripheral ring plate 16 is held inside the central ring plate 17, and the central ring plate 17 is held inside the outer peripheral ring plate 18. In addition, a dividing line $L_1$ between the inner peripheral ring plate 16 and the central ring plate 17 is located farther to the inside than a region S where the plurality of mounting stands 7 are arranged in a row in the circumferential direction. On the other hand, a dividing line $L_2$ between the central ring plate 17 and the outer peripheral ring plate 18 is located farther to the outside than the region S where the plurality of mounting stands 7 are arranged in a row in the circumferential direction. Namely, these dividing lines $L_1$ and $L_2$ are set at locations that do not overlap with the region S when viewed from overhead. As a result, the central ring plate 17 is arranged in opposition to the region S so as to overlap with the region S when viewed from overhead.

In addition, a first inner step portion 19 is provided in the outer peripheral portion on the lower surface side of the inner peripheral ring 16 over the entire circumference thereof. Corresponding thereto, a first outer step portion 20 is provided in the inner peripheral portion on the upper surface side of the central ring 17 over the entire circumference thereof. The first inner step portion 19 and the first outer step portion 20 are engaged in a state in which step surfaces 19a and 20a are in mutual contact. As a result, the outer peripheral portion of the inner peripheral ring plate 16 is supported vertically upward by the inner peripheral portion of the central ring plate 17.

Similarly, a second inner step portion 21 is provided in the outer peripheral portion on the lower surface side of the central ring plate 17 over the entire circumference thereof. Corresponding thereto, a second outer step portion 22 is provided in the inner peripheral portion on the upper surface side of the outer peripheral ring plate 18 over the entire circumference thereof. The second inner step portion 21 and the second outer step portion 22 are engaged in a state in which in which step surfaces 21a and 22a are in mutual contact. As a result, the outer peripheral portion of the central ring plate 17 is supported vertically upward by the inner peripheral portion of the outer peripheral ring plate 18.

In addition, gaps $t_1$ and $t_2$ are respectively provided between a lateral surface 19b of the first inner step portion 19 and a lateral surface 20b of the first outer step portion 20, and between a lateral surface 21b of the second inner step portion 21 and a lateral surface 22b of the second outer step portion 22. These gaps $t_1$ and $t_2$ are provided to prevent contact between the lateral surfaces 19b, 20b, 21b and 22b of adjacent ring plates 16, 17 and 18 on both sides of the aforementioned dividing lines $L_1$ and $L_2$ caused by thermal expansion during heating. Although these gaps $t_1$ and $t_2$ are selected arbitrarily, they are preferably provided within a range of 0.3 mm to 0.7 mm. Moreover, since the shield 12 is more susceptible to thermal expansion on the outside than on the inside, the inner gap $t_1$ can be set to a greater value than the outer gap $t_2$ ($t_1 > t_2$) in consideration thereof.

The aforementioned dividing lines $L_1$ and $L_2$ are provided based on the lateral surface 20b of the first outer step portion 20 and the lateral surface 21b of the second inner step portion 21 in the central ring plate 17 as viewed from the lower surface side of the shield 12. As a result, in the case of having set the aforementioned dividing lines $L_1$ and $L_2$ at locations that do not overlap with the region S when viewed from overhead, the central ring plate 17 can be arranged so as to overlap with the region S when viewed from overhead.

The inner peripheral ring plate 16, the central ring plate 17 and the outer peripheral ring plate 18 are formed to mutually the same thickness. The lower surfaces of the shield 12 composed by these ring plates 16, 17 and 18 are mutually on the same plane. As a result, high-quality SiC epitaxial layers can be stably deposited and grown on the surfaces of the SiC wafers W while smoothly supplying the raw material gas G released from the aforementioned gas introduction pipe 9 from the inside towards the outside of the reaction space K. Furthermore, the upper surfaces of each of the ring plates 16, 17 and 18 of the shield 12 are also mutually on the same plane.

In the CVD device 1B having the structure described above, effects can be obtained that are the same as those obtained with the aforementioned CVD device 1A shown in FIG. 1. Namely, in this CVD device 1B, the shield 12 is arranged in close proximity to the lower surface of the ceiling 3 so as to prevent deposits from being deposited on the lower surface of the ceiling 3 as previously described. As a result, deposits are deposited on the lower surface of the shield 12.

In this CVD device 1B, since the shield 12 is removably attached in a chamber, the aforementioned particles and downfall can be reduced simply by carrying out simple maintenance work consisting of replacing the shield without having to carry out bothersome cleaning work such as removing deposits deposited on the lower surface of the ceiling 3 as in the prior art.

When replacing the shield 12, the shield 12 located to the inside of the aforementioned sidewall 4 can be easily removed or attached by moving the aforementioned ceiling 3 vertically.

Moreover, in this CVD device 1B, when the shield 12 has undergone thermal deformation as a result of being heated by the induction coils 8 as previously described, the fine surface irregularities 31 are formed so that those deposits S deposited on the lower surface of the shield 12, which were deposited by using each of the convex portions 32a of the shape of the surface irregularities 32 as starting points, do not fall off as a result of collisions between mutually adjacent convex portions 32a.

As a result, collision of the aforementioned deposits deposited using each of the convex portions 32 of the shape of the surface irregularities 32 as starting points between mutually adjacent convex portions 32a can be avoided, and as a result thereof, deposits deposited on the lower surface of the shield 12 can be inhibited from falling off.

Moreover, as a result of using the aforementioned shield 12 concentrically divided into a plurality of ring plates 16, 17 and 18 around the opening 13, thermal stress acting on the shield 12 can be alleviated among these divided ring plates 16, 17 and 18.

More specifically, in this CVD device 1B, although the dividing line $L_1$ between the inner peripheral ring plate 16 and the central ring plate 17 is located farther to the inside than the region S where the plurality of mounting stands 7 are arranged in a row in the circumferential direction, the dividing line $L_2$ between the central ring plate 17 and the outer peripheral ring plate 18 is located farther to the outside than this region S.

In this case, when a thermal change has acted on the shield 12 as a result of being heated by the induction coils 8, thermal stress acting on the inner peripheral side and outer peripheral side of the shield 12 where there are large changes in heat can be efficiently alleviated. Thus, the occurrence of warping (deformation) or cracking and the like of the shield 12 divided into the plurality of ring plates 16, 17 and 18 can be prevented.

In addition, in the present invention, deposits deposited on the lower surface of the shield 12 can be inhibited from falling off by preventing the occurrence of warping (deformation) of the shield 12. In particular, since the aforementioned shield 12 is composed of a graphite substrate coated with the same SiC film as the SiC epitaxial layers on the surface thereof, the depositability of deposits can be enhanced. As a result, deposits deposited on the lower surface of the shield 12 can be inhibited from falling off. In addition, the times at which each of the ring plates 16, 17 and 18 that compose the shield 12 is replaced can be extended.

Moreover, in the present invention, it is also possible to only replace one ring plate 16 (or 17 or 18) of the shield 12 divided into the plurality of ring plates 16, 17 and 18.

For example, in SiC deposits deposited on the lower surface of the aforementioned shield 12, there is a region where the ratio of Si is greater that is present to the inside of a region where the ratios of Si and C contained in the SiC deposits are equal. In addition, this region where the ratio of Si is greater has been determined to result in more rapid growth of SiC deposits than the region where the ratios of Si and C are equal.

Therefore, in the present invention, the location of the dividing line $L_1$ between the aforementioned inner peripheral ring plate 16 and the aforementioned central ring plate 17 is set so that the aforementioned inner peripheral ring plate 16 is arranged in this region where the ratio of Si is greater. As a result, the times at which the other ring plates 17 and 18 are replaced can be extended by replacing only the inner peripheral ring plate 16 of the shield divided into a plurality of the ring plates 16, 17 and 18 that is arranged in this region where the ratio of Si is greater.

The present invention is not necessarily limited to the aforementioned second embodiment, but rather various modifications can be added within a range that does not deviate from the gist of the present invention. In addition, in the following explanation, in addition to omitting explanations of those sites that are the same as those of the aforementioned CVD device 1, the same reference symbols are used to represent those sites that are the same as in the aforementioned CVD device 1.

In the present invention, a configuration can be employed in which, for example, the central ring plate 17 is divided into a plurality of ring pieces 12a and 12b along dividing lines $L_3$ extending in the radial direction in the manner of the shield 12 shown in FIG. 8.

More specifically, the central ring plate 17 is divided into two ring pieces 17a and 17b so as to be symmetrical about the two dividing lines $L_3$ extending in the diametrical direction. In this case, thermal stress acting on the shield 12A can be further alleviated between the divided ring pieces 17a and 17b. Thus, the occurrence of warping (deformation) or cracking and the like in the central ring plate 17 divided into a plurality of ring pieces 17a and 17b can be further inhibited.

In the present invention, a configuration can be employed in which any ring plate 16 (or 17 or 18) among the plurality of concentrically divided ring plates 16, 17 and 18 is divided into a plurality of ring pieces along dividing lines extending in the radial direction centering around the opening 13. In addition, the number of divided ring pieces and the locations of the dividing lines can be altered as is suitable.

In addition, in the aforementioned embodiment, although an explanation was provided regarding a configuration in which the aforementioned shield 12 was divided into three ring plates consisting of ring plates 16, 17 and 18, the number of concentrically divided ring plates around an opening can be altered as is suitable.

For example, a configuration can be employed in which a shield is divided into two sections consisting of an inner peripheral ring plate 16A (16B) and an outer peripheral ring plate 18A (18B) in the manner of shields 12B and 12C shown in FIGS. 9A, 9B, 10A and 10B.

In this case as well, thermal stress acting on the shield 12 can be alleviated between these two divided ring plates 16A (16B) and 18A (18B).

In addition, in the case of composing the shield 12B (12C) with the two divided ring plates 16A (16B) and 18A (18B), the dividing line $L_1$ ($L_2$) between the inner peripheral ring plate 16A (16B) and the outer peripheral ring plate 18A (18B) is preferably located farther to the inside or outside than the region S where the plurality of mounting stands 7 are arranged in a row in the circumferential direction so as not to overlap with this region S.

Figure 9A:
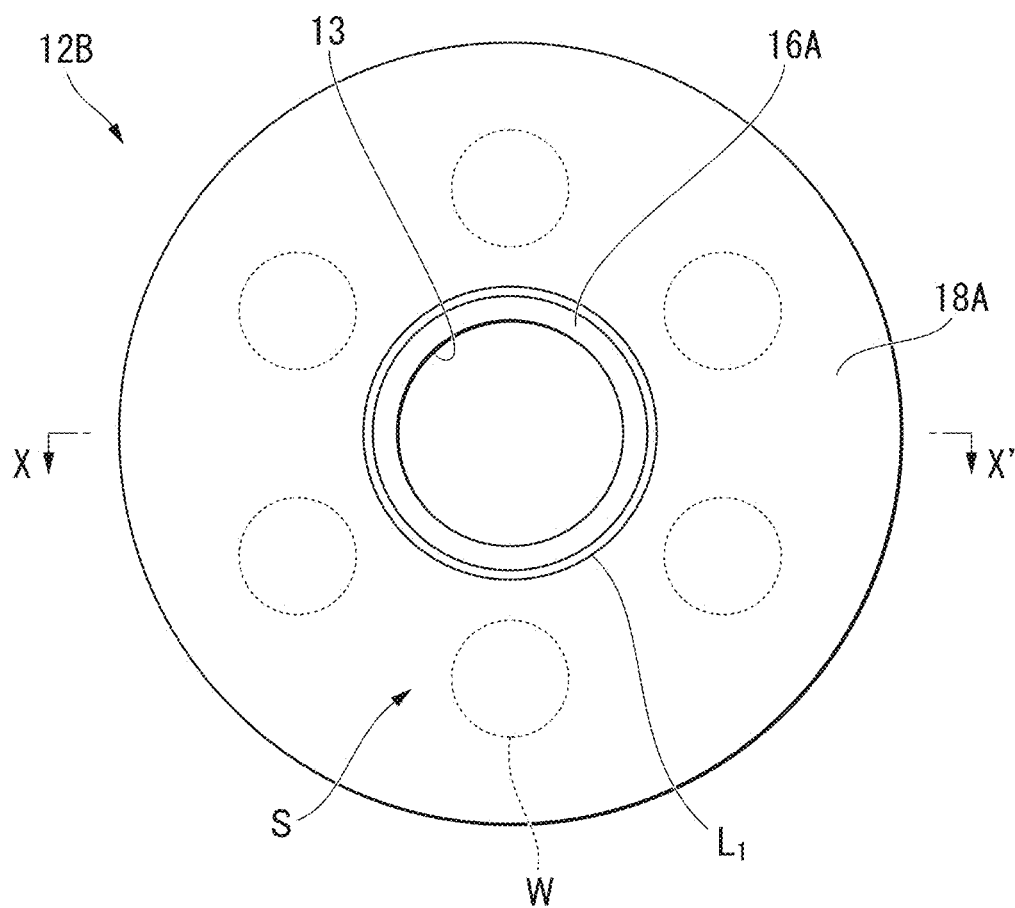
FIG. 9A is an overhead view of an example of a shield divided into two sections.
Figure 9B:
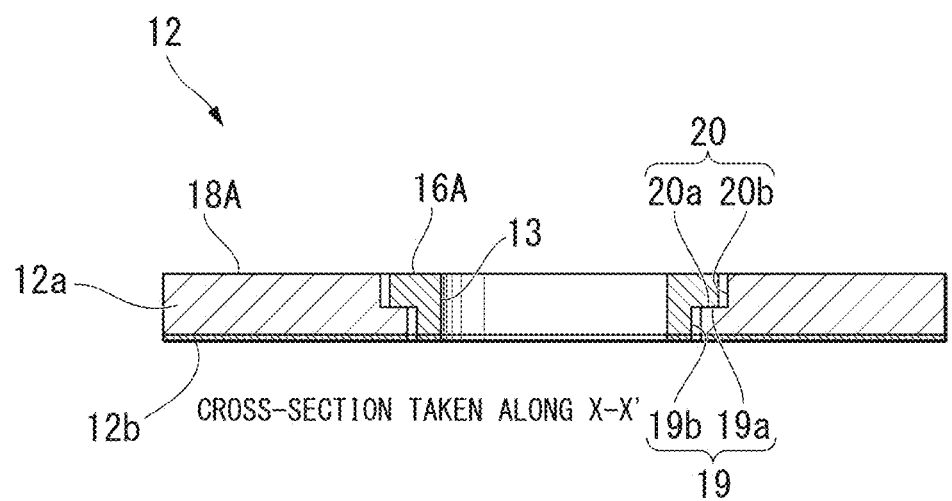
FIG. 9B is a cross-sectional view of the aforementioned example of a shield divided into two sections.

Namely, by positioning the dividing line $L_1$ between the inner peripheral ring plate 16A and the outer peripheral ring plate 18A farther to the inside than the region S in the manner of the shield 12B shown in FIGS. 9A and 9B, heat stress acting on the inner peripheral side of the shield 12, where there are large changes in heat, can be efficiently alleviated. Moreover, the location of the dividing line $L_1$ is set so that the inner peripheral ring plate 16A is arranged in the aforementioned region where the ratio of Si is greater. As a result, it is possible to only replace the inner peripheral ring plate 16A arranged in the aforementioned region where the ratio of Si is greater, thereby making it possible to extend the time at which the outer peripheral ring plate 18A is replaced.

Figure 10A:
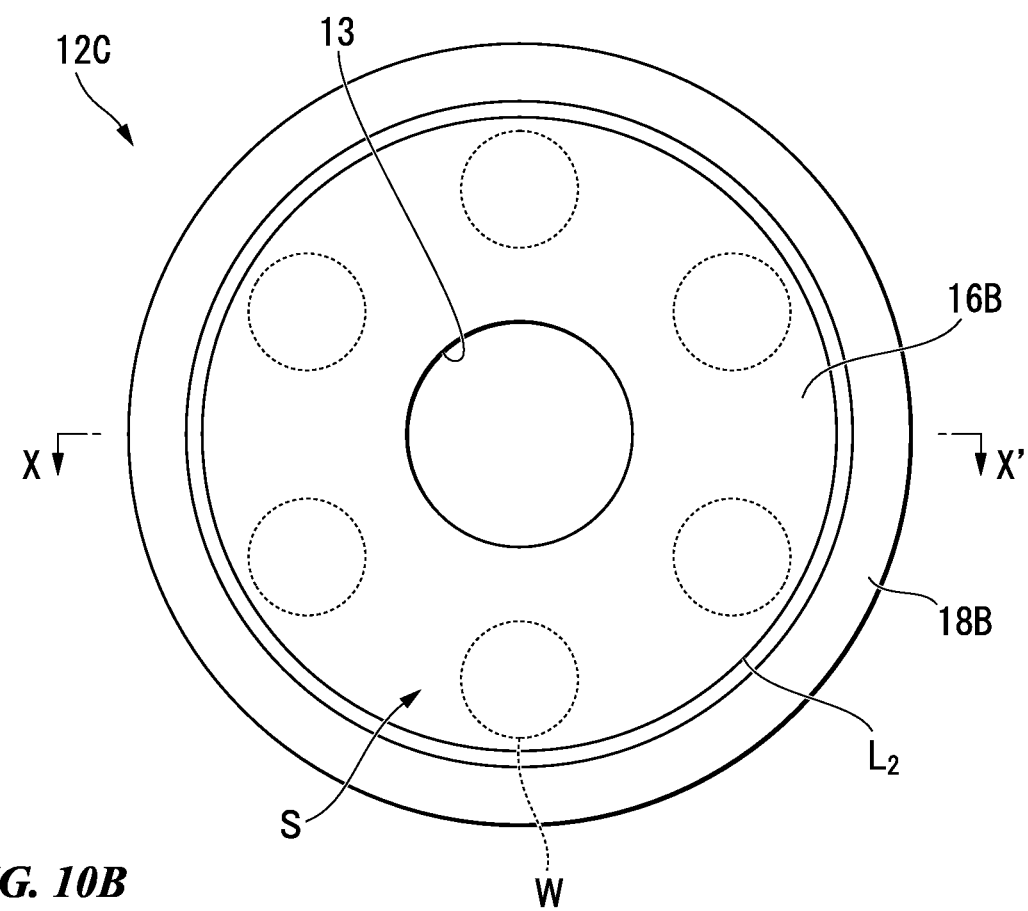
FIG. 10A is an overhead view of another example of a shield divided into two sections.
Figure 10B:
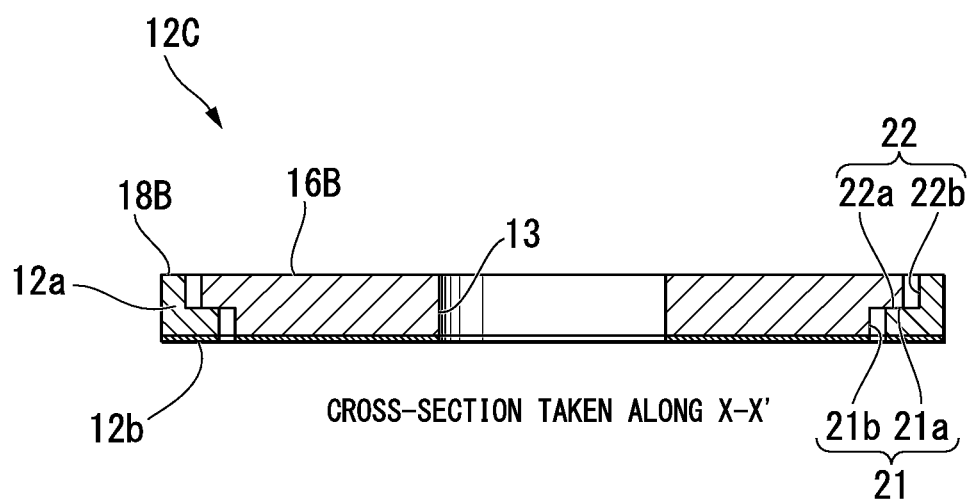
FIG. 10B is a cross-sectional view of the aforementioned other example of a shield divided into two sections.

On the other hand, thermal stress acting on the outer peripheral side of the shield 12, where there are large changes in heat, can be efficiently alleviated by positioning the dividing line $L_2$ between the inner peripheral ring plate 16B and the outer peripheral ring plate 18B farther to the outside than the region S in the manner of the shield 12C shown in FIGS. 10A and 10B. Since changes in heat are greater on the outer peripheral side than the inner peripheral side of the shield in particular, this is particularly effective in cases of preventing the occurrence of warping (deformation) or cracking of the shield 12C.

In the present invention, in the case of having divided the shield into a plurality of ring plates, different materials can be used for these ring plates. In this case, a graphite substrate coated with the same SiC film as the SiC epitaxial layers on the surface thereof is preferable for the ring plate arranged at a location opposing the aforementioned region S (location where overlapping when viewed from above). However, a combination of different materials, such as a graphite substrate coated with a TaC film on the surface thereof, can also be used for the ring plate arranged at a location that overlaps with the aforementioned region S when viewed from overhead.

(Epitaxial Wafer Manufacturing Method)

The epitaxial wafer manufacturing method to which the present invention is applied is characterized by comprising a step for depositing and growing epitaxial layers on the surfaces of wafers using the aforementioned CVD device 1 of the present invention.

When manufacturing epitaxial wafers, after having sliced SiC ingots fabricated using a method such as sublimation crystallization into the shape of discs, SiC wafers that have undergone polishing and the like on the surfaces thereof are fabricated or prepared. Epitaxial wafers can then be fabricated by depositing and growing (epitaxially growing) SiC epitaxial layers on the surfaces of the SiC wafers using the aforementioned CVD device 1.

In the epitaxial wafer manufacturing method to which the present invention is applied, high-quality SiC epitaxial layers can be stably deposited and grown on the surfaces of the SiC wafers W by using the aforementioned CVD device 1. Since the amount of time spent on maintaining the aforementioned CVD device 1 can be shortened, the product yield of epitaxial wafers can be further improved.

Furthermore, in the present invention, the term "plurality" refers to any arbitrary number of at least 2 or more.

EXAMPLES

The following provides a more detailed explanation of the effects of the present invention through examples thereof. The present invention is not limited to the following examples, and can be carried out by suitably modifying within a range that does not deviate from the gist thereof.

First Example

Figure 11:
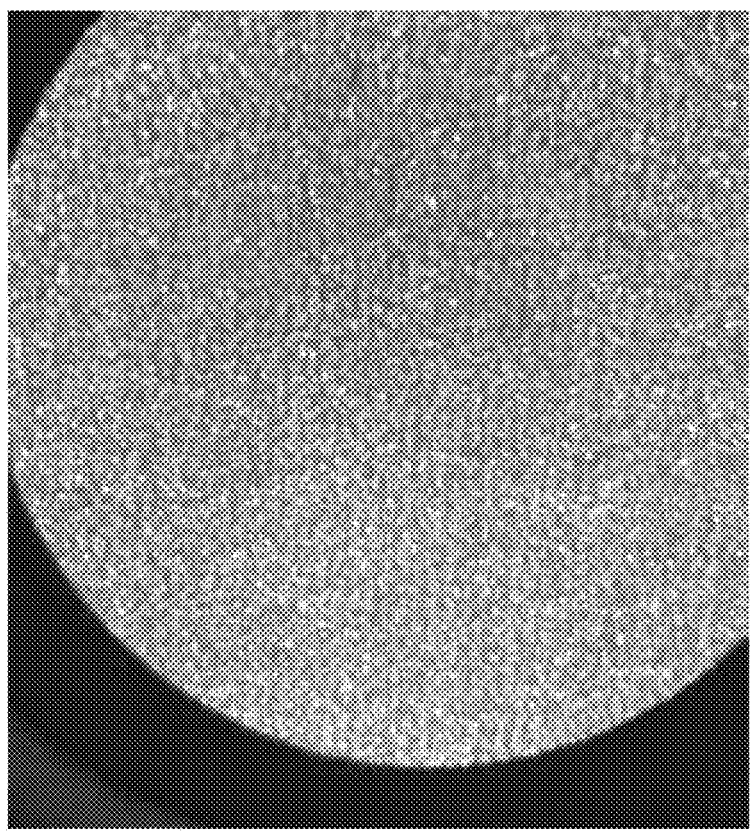
FIG. 11 is a photomicrograph depicting the shield of the present invention.

In the first example, a shield similar to the aforementioned shield shown in FIGS. 3A to 3C was fabricated. After preparing a graphite substrate having a diameter of 200 mm, opening diameter of 60 mm and thickness of 2 mm, and forming fine surface irregularities in the surface of this substrate, the shield of the present invention was fabricated by coating with an SiC thin film having a film thickness of 60 μm. The height of the fine surface irregularities (height difference between convex portions and concave portions) was about 2 μm and the interval between mutually adjacent convex portions of the fine surface irregularities was about 100 μm. In addition, a photomicrograph depicting the substrate surface of this shield is shown in FIG. 11.

Figures 12, 13:
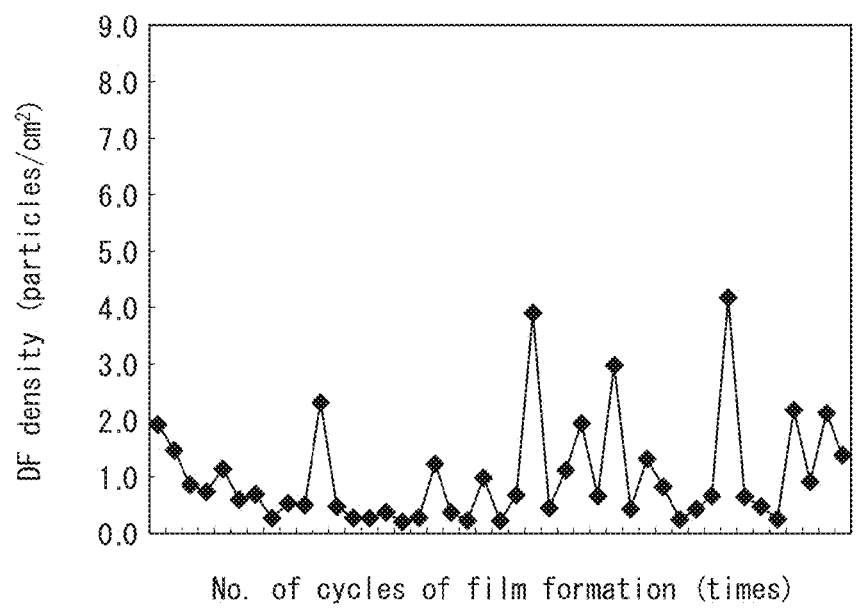
FIG. 12 is a graph obtained by measuring the relationship between the number of cycles of film formation and DF density in the case of using a shield of the prior art.
FIG. 13 is a graph obtained by measuring the relationship between the number of cycles of film formation and DF density in the case of using the shield of the present invention.

The results of measuring downfall density (DF density) when a film formation step was repeatedly carried out using a shield of the prior art in which fine surface irregularities were not formed are shown in FIG. 12, while the results of measuring DF density when a film formation step was repeatedly carried out using the shield of the present invention are shown in FIG. 13.

As a result, as shown in FIGS. 12 and 13, when film formation was repeatedly carried out using a shield of the prior art, sudden increases in downfall occurred. In contrast, the occurrence of downfall was determined to be inhibited when a film formation step was repeatedly carried out using the shield of the present invention.

Second Example

Figure 14:
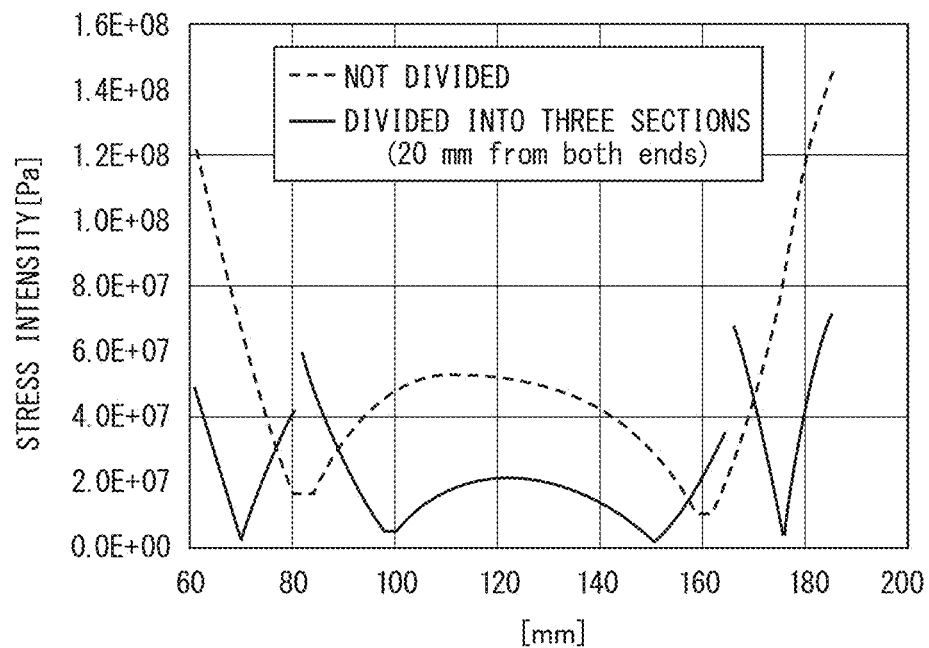
FIG. 14 is a graph indicating the results of calculating thermal stress acting on a shield divided into three sections by computer simulation (at 20 mm from both ends).
Figure 15:
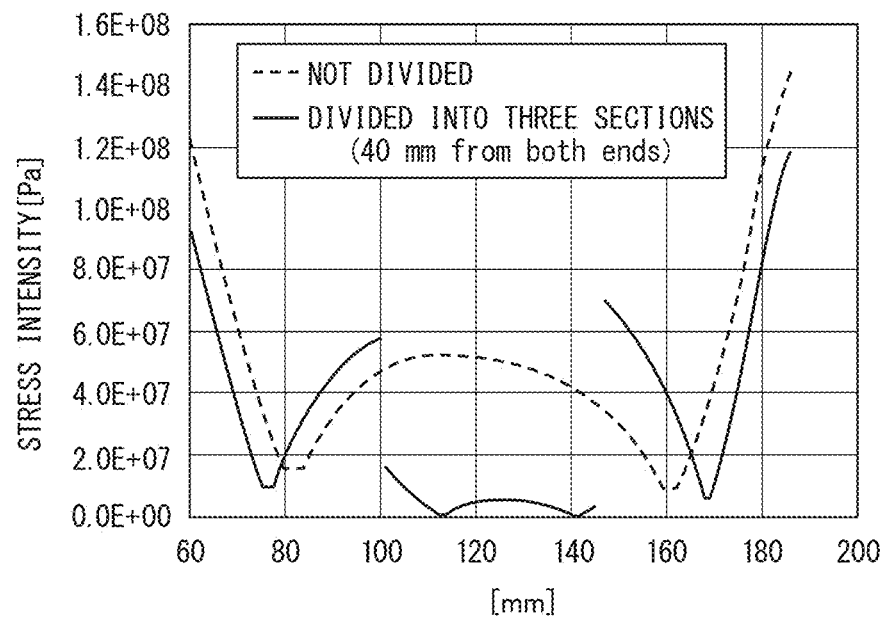
FIG. 15 is a graph indicating the results of calculating thermal stress acting on the aforementioned shield divided into three sections by computer simulation (at 40 mm from both ends).

In the second example, thermal stress actually acting on a shield divided into three concentric ring plates centering around an opening was calculated by computer simulation. The results of this computer simulation are shown in FIGS. 14 and 15. In this computer simulation, an SiC substrate (shield) having a diameter of 200 mm, opening diameter of 60 mm and thickness of 2 mm was divided into three concentric ring plates centering around the opening, and calculations were carried out by setting the dividing lines of these ring plates at locations 20 mm (FIG. 14) and 40 mm (FIG. 15), respectively, from both ends of the inner periphery and outer periphery. In addition, calculations were carried out based on a coefficient of thermal expansion of SiC of $4.5 \times 10^{-6}/°$ C. and setting the heating temperature thereof to 1700° C. In addition, the graphs of FIGS. 14 and 15 also indicate simulation results for the case of not dividing the shield into ring plates for reference purposes.

As shown in FIGS. 14 and 15, thermal stress acting on the shield was determined to be alleviated among the three divided ring plates. Thermal stress acting on the inner peripheral side and outer peripheral side of the shield, where there are particularly large changes in heat, was able to be efficiently alleviated.

Next, in a configuration similar to that of the shield 12 shown in the aforementioned FIGS. 7A and 7B, changes in the gaps $t_1$ and $t_2$ after heating were calculated by computer simulation in the case of making the width of the step surfaces of each step portion to be 4.0 mm, making the gap $t_1$ between the step portions of the inner peripheral ring plate and the central ring plate to be 0.4 mm, and making the gap $t_2$ between the step portions of the central ring plate and the outer peripheral ring plate to be 0.6 mm. The results of this simulation are shown in Table 1. The width of the portion contacted by the step portion surfaces (value determined by subtracting the gap $t_2$ or $t_1$ from the width of the step surface) is also shown in Table 1 along with the gaps $t_1$ and $t_2$.

TABLE 1

| (Units: mm) | | Before heating | After heating |
|---|---|---|---|
| Inner peripheral ring plate to central ring plate | Contact portion | 3.6 | 3.571 |
| | Gap $t_1$ | 0.4 | 0.399 |
| Central ring plate to outer peripheral ring plate | Contact portion | 3.4 | 3.408 |
| | Gap $t_2$ | 0.6 | 0.457 |

As shown in Table 1, although the gap $t_1$ between the step portions of the inner peripheral ring plate and the central ring plate and the gap $t_2$ between the step portions of the central ring plate and the outer peripheral ring plate decreased due to thermal expansion after heating, contact between the lateral surfaces of the step portions of adjacent ring plates on both sides of the dividing line was able to be prevented.

INDUSTRIAL APPLICABILITY

According to the epitaxial wafer manufacturing device of the present invention, high-quality epitaxial layers can be stably deposited and grown on the surfaces of wafers.

DESCRIPTION OF REFERENCE SIGNS 1A, 1B CVD device (epitaxial wafer manufacturing device)
2 Susceptor
3 Ceiling (top plate)
4 Sidewall
5 Turntable
6 Rotating shaft
7 Mounting stands (mounting portions)
8 Induction coils (heating means)
9 Gas introduction pipe (gas inlet)
10 Opening
11 Support ring (support member)
12, 12A, 12B, 12C Shield
12a Substrate
12b Thin film
13 Opening
14 Support portion (step portion)
15 Sleeve portion
16, 16A Inner peripheral ring plate
17 Central ring plate
18A, 18B Outer peripheral ring plate
19 First inner step portion
19a Step surface
19b Lateral surface
20 First outer step portion
20a Step surface
20b Lateral surface
21 Second inner step portion
21a Step surface
21b Lateral surface
22 Second outer step portion
22a Step surface
22b Lateral surface
31 Fine surface irregularities
31a Projections (convex portions)
31b Concave portions
32 Shape of surface irregularities
32a Convex portions
32b Concave portions
G Raw material gas
K Reaction space
W SiC wafers (wafers)

The invention claimed is:

1. An epitaxial wafer manufacturing device that deposits and grows SiC epitaxial layers on the surfaces of heated wafers while supplying a raw material gas to a chamber, provided with:
   a susceptor having a plurality of mounting portions on which the wafers are mounted, wherein the plurality of mounting portions are arranged in a row in the circumferential direction;
   a top plate arranged in opposition to the upper surface of the susceptor so as to form a reaction space between the top plate and the susceptor;
   a heating means arranged on the lower surface side of the susceptor and/or upper surface side of the top plate for heating the wafers mounted on the mounting portions;
   a gas supply means having a gas inlet for introducing the raw material gas from a central portion of the upper surface of the top plate to the reaction space, that supplies raw material gas released from the gas inlet from the inside to the outside of the reaction space; and,
   a shield removably attached inside the chamber and arranged in close proximity to the lower surface of the top plate so as to prevent deposits from being deposited on the lower surface of the top plate; wherein,
   the shield has a graphite substrate having an opening in the central portion thereof that forces the gas inlet to face the inside of the reaction space, and a thin film that covers the lower surface of this substrate,
   the surface of the thin film has the shape of surface irregularities corresponding to fine surface irregularities formed in the lower surface of the substrate,
   the height of the fine surface irregularities is within the range of 2 μm to 50 μm, the thickness of the thin film is within the range of 30 μm to 200 μm, and the interval between mutually adjacent convex portions of the fine surface irregularities is within the range of 50 μm to 150 μm, and
   when the shield has undergone thermal deformation as a result of being heated by the heating means, deposits deposited on the lower surface of the shield are inhibited from falling off by the shape of the surface irregularities.

2. The epitaxial wafer manufacturing device according to claim 1, wherein the fine surface irregularities are formed on the surface of the substrate by carrying out any of texturing, lithography or transfer printing.

3. The epitaxial wafer manufacturing device according to claim 1, provided with a sidewall located outside the susceptor and the top plate and arranged so as to surround the periphery of the reaction space, wherein
   a support portion for supporting the shield is provided on the inner peripheral surface of the sidewall.

4. The epitaxial wafer manufacturing device according to claim 3, wherein the support portion is a step portion provided over the entire circumference on the inner peripheral surface of the sidewall, and supports the shield in a state in which the outer peripheral portion of the shield is mounted on this step portion.

5. The epitaxial wafer manufacturing device according to claim 1, wherein the shield has a structure in which it is concentrically divided into a plurality of ring plates around the opening.

6. The epitaxial wafer manufacturing device according to claim 5, wherein, among adjacent ring plates on both sides of each dividing line of the plurality of concentrically divided ring plates, an inner step portion provided on the outer peripheral portion on the lower surface side of the ring plate located to the inside of the dividing line, and an outer step portion provided on the inner peripheral portion on the upper surface side of the ring plate located to the outside of the dividing line, are engaged in a state in which their mutual step surfaces are in contact, and a gap is provided between the lateral surface of the inner step portion and the lateral surface of the outer step portion.

7. The epitaxial wafer manufacturing device according to claim 5, wherein at least the lower surfaces of the plurality of concentrically divided ring plates are on the same plane.

8. The epitaxial wafer manufacturing device according to claim 5, wherein the shield has a structure in which it is divided into an inner peripheral ring plate, a central ring plate and an outer peripheral ring plate moving from the inside to the outside, and
   a dividing line between the inner peripheral ring plate and the central ring plate is located farther to the inside than the region where the plurality of mounting portions are arranged in a row in the circumferential direction, and
   a dividing line between the central ring plate and the outer peripheral ring plate is located farther to the outside than the region where the plurality of mounting portions are arranged in a row in the circumferential direction.

9. The epitaxial wafer manufacturing device according to claim 5, wherein the shield has a structure in which it is divided into an inner peripheral ring plate and an outer peripheral ring plate moving from the inside to the outside, and
   a dividing line between the inner peripheral ring plate and the outer peripheral ring plate is located farther to the inside or outside than the region where the plurality of mounting portions are arranged in a row in the circumferential direction.

10. The epitaxial wafer manufacturing device according to claim 8, wherein the wafer is an SiC single crystal substrate and the epitaxial layer is an SiC single crystal thin film, and
    in an SiC deposit deposited on the lower surface of the shield, has a region where the ratio of Si is greater to the inside of a region where the ratios of Si and C contained in the SiC deposit are equal, and a dividing line between the inner peripheral ring plate and the central or outer peripheral ring plate is positioned so that the inner peripheral ring plate is arranged in this region where the ratio of Si is greater.

11. The epitaxial wafer manufacturing device according to claim 5, wherein any of the ring plates among the plurality of concentrically divided ring plates is divided into a plurality of ring pieces along dividing lines extending in the radial direction centering on the opening.

12. The epitaxial wafer manufacturing device according to claim 5, wherein the wafer is an SiC single crystal substrate and the epitaxial layer is an SiC single crystal thin film, and
    a graphite substrate coated with an SiC thin film on the surface thereof is at least used for the ring plate arranged at a location opposing the region where the plurality of mounting portions are arranged in a row in the circumferential direction.

13. The epitaxial wafer manufacturing device according to claim 1, having a structure wherein the susceptor is driven to rotate about the central axis thereof and the plurality of mounting portions are driven to rotate about their respective central axes.

14. A SiC epitaxial wafer manufacturing method, comprising a step for depositing and growing SiC epitaxial layers on the surfaces of wafers using the epitaxial wafer manufacturing device according to claim 1.

* * * * *